(12) United States Patent
Tanaka

(10) Patent No.: US 8,482,081 B2
(45) Date of Patent: Jul. 9, 2013

(54) SEMICONDUCTOR APPARATUS AND MANUFACTURING METHOD THEREOF

(75) Inventor: Mitsuo Tanaka, Fukui (JP)

(73) Assignee: Panasonic Corporation, Osaka (JP)

( * ) Notice: Subject to any disclaimer, the term of this patent is extended or adjusted under 35 U.S.C. 154(b) by 95 days.

(21) Appl. No.: 12/956,376

(22) Filed: Nov. 30, 2010

(65) Prior Publication Data

US 2011/0127615 A1 Jun. 2, 2011

(30) Foreign Application Priority Data

Dec. 1, 2009 (JP) ................................ 2009-273525

(51) Int. Cl.
- H01L 29/66 (2006.01)
- H01L 21/8249 (2006.01)

(52) U.S. Cl.
USPC .......................................... 257/378; 438/236

(58) Field of Classification Search
USPC .................. 438/202–208, 234–239; 257/370, 257/378
See application file for complete search history.

(56) References Cited

U.S. PATENT DOCUMENTS

| | | | |
|---|---|---|---|
| 5,198,692 A | 3/1993 | Momose | |
| 5,596,221 A | 1/1997 | Honda | |
| 5,986,326 A | 11/1999 | Kato | |
| 6,001,676 A * | 12/1999 | Sawada et al. | 438/202 |
| 7,005,337 B2 * | 2/2006 | Berthold et al. | 438/202 |

FOREIGN PATENT DOCUMENTS

| | | |
|---|---|---|
| JP | 2-180023 | 7/1990 |
| JP | 7-153859 | 6/1995 |
| JP | 2001-148435 | 5/2001 |

* cited by examiner

*Primary Examiner* — Calvin Lee
(74) *Attorney, Agent, or Firm* — McDermott Will & Emery LLP

(57) ABSTRACT

A high-performance semiconductor apparatus which can be easily introduced into the MOS process, reduces the leakage current (electric field strength) between the emitter and the base, and is insusceptible to noise or surge voltage, and a manufacturing method of the semiconductor apparatus. The emitter 111 is formed by performing the ion implantation twice by using the conductive film (109) as a mask. The second emitter area (111*b*) is formed by ion implantation of a low impurity density impurity ion, and the first emitter area (111*a*) is formed by ion implantation of a high impurity density impurity ion. As a result, the low impurity density second emitter area is formed in the circumference of the emitter 111, which lowers the electric field strength, and reduces the leakage current. Also the conductive film is connected with the emitter electrode (116), which makes the apparatus insusceptible to noise.

8 Claims, 20 Drawing Sheets

SEMICONDUCTOR APPARATUS AND MANUFACTURING METHOD THEREOF

The disclosure of Japanese Patent Application No. 2009-273525 filed Dec. 1, 2009 including specification, drawings and claims is incorporated herein by reference in its entirety. Also, applications cited in the text of the present application, documents or references cited in the applications, and documents or references cited in the documents or references are incorporated herein by reference in the present application. The documents and the like incorporated in the present application may be used for implementing the present invention.

BACKGROUND OF THE INVENTION

1. Field of the Invention

The present invention relates to a semiconductor apparatus and a manufacturing method thereof, in particular to a high-performance, low-cost bipolar transistor for use in a BiMOS or BiCMOS circuit, and a manufacturing method thereof.

2. Description of the Related Art

In recent years, as the integration and functionality of the semiconductor integrated circuit becomes higher, it has become very important to achieve a high-performance analog-digital mixed integrated circuit on which an analog signal processing circuit and a digital signal processing circuit are integrated. A typical method for designing a digital circuit is to use a CMOS (Complementary Metal Oxide Semiconductor) including a MOS transistor to achieve both a large size and a low electricity consumption. Accordingly, the cases where a MOS transistor is used in an analog circuit as well have increased.

The MOS transistor, however, has a defect that the transconductance (hereinafter referred to as "gm") is low compared with the bipolar transistor. For this reason, compared with the bipolar transistor, the gain of analog circuit (signal amplification factor) is decreased, and the circuit current increases when it obtains the same gain as the bipolar transistor. Also, in the case of the MOS transistor, the current that flows between the source and drain flows the surface of the semiconductor substrate. This makes the current susceptible to the effect of the crystal lattice defect that exists on the surface of the semiconductor substrate, flicker-noise characteristic (also referred to as "1/f noise characteristic") is deteriorated compared with the bipolar transistor.

Furthermore, the MOS transistor is inferior than the bipolar transistor in the mismatch characteristic (difference between threshold voltages of the pair transistor) which is an important factor in the analog circuit. In the case of a MOS transistor, the difference between threshold voltages of the pair transistor (hereinafter referred to as $\Delta V\text{th}$) is affected by many factors such as variation in the size of MOS electrode, variation in thickness of gate insulation film, variation in well surface density, and variation in density of impurities in the gate Poly-Si electrode. On the other hand, in the case of a bipolar transistor, the difference between threshold voltages of the pair transistor (hereinafter referred to as $\Delta V\text{be}$) is determined by the two factors: variation in emitter-base junction area; and variation in density of impurities in the emitter and the base. Accordingly, $\Delta V\text{be}$ is smaller than $\Delta V\text{th}$.

It is understood from the above that use of a bipolar transistor in the analog circuit provides an advantageous effect to achieve the high-performance (low electricity consumption, low noise, low variation) analog circuit in the analog-digital mixed integrated circuit. However, when a bipolar transistor is loaded in the CMOS process used in the digital circuit, the following problems arise: high cost due to increase in the number of process steps; deterioration in the characteristic of the MOS transistor due to addition of thermal process or processing process for forming the bipolar transistor; and high cost due to increase in chip area (this problem arises because the bipolar transistor is larger in area than the MOS transistor).

Patent Literature 1 identified under proposes a manufacturing method of a semiconductor apparatus that can form the emitter and the base only by adding the ion implantation step and the thermal processing step into the CMOS process. According to this manufacturing method, it is possible to restrict the increase in the number of steps and addition of manufacturing processes when the manufacturing process of the bipolar transistor is incorporated into the CMOS process. Also, by using the polysilicon film as a mask, it is possible to improve the lithography step in accuracy and reduce the emitter area. In the following, this manufacturing method will be explained with reference to FIGS. 20A through 20D.

FIGS. 20A through 20D are cross-sectional views showing manufacturing steps of a bipolar transistor. As shown in FIG. 20A, an n-type buried layer 3 and an n-type epitaxial layer 2 are formed on a p-type semiconductor substrate 1, a p-type device separation area 4 is formed by the thermal diffusion of boron (B), an insulation layer 6 is formed on the surface of the epitaxial layer 2 by the selective oxidization (LOCOS) method, an oxidization layer 7 is formed on a portion of the surface of the epitaxial layer 2 in which the insulation layer 6 does not exist, and an inner base 8 is formed.

Next, as shown in FIG. 20B, a ring-like polysilicon layer 9 is formed by deposition of a polysilicon layer and etching, and an outer base area 10 is formed by performing an ion implantation of boron by using a resist layer 11 and the ring-like polysilicon layer 9 as a mask.

Subsequently, as shown in FIG. 20C, an emitter 12 and a collector contact 13 are formed by performing an ion implantation of arsenic (As) by using a resist layer 14 and the ring-like polysilicon layer 9 as a mask. Subsequently, as shown in FIG. 20D, after the resist layer 14 is removed, an insulation film 15 is deposited on the surface by the CVD (Chemical Vapor Deposition) method, then contact holes are formed at positions corresponding to the emitter 12, the collector contact 13, and the outer base area 10, and then electrodes 16 are formed with an electrode material such as aluminum (Al).

According to this manufacturing method of the bipolar transistor, the emitter contact is formed so as to be in contact with both the emitter 12 and the ring-like polysilicon layer 9. With this structure, there is no need for the emitter 12 to be larger in area than the emitter contact, which makes it possible to form a very small emitter. As a result, it is possible to reduce area of the cells and increase the number of devices formed in the semiconductor substrate. Also, with the reduction in area of emitters, the junction capacitance decreases, and the high-frequency characteristics are improved.

CITATION LIST

Patent Literature

[Patent Literature 1] Japanese Patent Application Publication No. H2-180023

SUMMARY OF THE INVENTION

Problems to be Solved by the Invention

The above-described analog-digital mixed integrated circuit provides a bipolar transistor having excellent high-frequency characteristics and current amplification factor.

As the structure of a bipolar transistor having excellent high-frequency characteristics, the Poly-Si emitter structure and the SiGe hetero bipolar transistor structure have been proposed, wherein in the Poly-Si emitter structure, the emitter diffusion layer is formed with a polycrystal Si film (hereinafter also referred to as "polysilicon film" or "Poly-Si film"), and in the SiGe hetero bipolar transistor structure, the base area is formed with a SiGe epitaxial film. However, loading any of these bipolar transistors in the CMOS process would face the problems of an increase in the process cost and a deterioration of the MOS characteristics. Also, in these bipolar transistors, increases in variations in the emitter ground amplification factor (hereinafter referred to as "hFE") and $\Delta Vbe$ occur due to variation in the natural oxide film which exists between the emitter and the base, and an increase in $1/f$ noise occurs due to the Poly-Si film of the emitter. Thus compared with a bipolar transistor in which the emitter and the base have been formed by the ion implantation and the thermal process, these bipolar transistors have increases in variations in hFE and $\Delta Vbe$ and an increase in $1/f$ noise.

Accordingly, at present, it is considered that a bipolar transistor in which the Poly-Si emitter structure or the SiGe hetero bipolar transistor structure is adopted does not suit for the analog-digital mixed integrated circuit.

In view of this, it is important to realize a high-performance bipolar transistor only by adding the ion implantation step and the thermal processing step into the CMOS process without using the Poly-Si emitter structure or the like, in order for a high-performance bipolar transistor, which is excellent in high-frequency characteristics, low-noise, low-variation, and small in area, to be realized with addition of a small number of process steps into the CMOS process without deterioration in the MOS characteristics so that a high-performance analog-digital mixed integrated circuit can be realized.

According to the conventional manufacturing method of semiconductor apparatus, it is possible to obtain a bipolar transistor which is high-performance to some extent, by adding the ion implantation step and the thermal processing step into the CMOS process.

However, in the conventional manufacturing method of semiconductor apparatus, when the emitter diffusion layer is made shallower to improve the high-frequency characteristics of the bipolar transistor, the curvature radius in the cross section in thickness direction becomes smaller around the circumference of the emitter and the electric field strength of the pn junction becomes higher. When the electric field strength becomes higher, breakdown voltage becomes lower, which causes a problem that a leak is apt to occur. Especially, the electric field strength is apt to increase at the boundary between the emitter surface layer and the base surface layer due to the electric field concentration.

Also, in the conventional manufacturing method of semiconductor apparatus, when the emitter diffusion layer is made shallower, the amount of expansion of the emitter diffusion layer in the horizontal direction becomes smaller, and thus the emitter diffusion layer located under the ring-like polysilicon layer becomes smaller. This causes the electrode material to be closer to the junction between the emitter diffusion layer and the base diffusion layer in the vicinity of the emitter contact, increasing the amount of leakage current between the emitter and the base. This is also a problem. That is to say, when the emitter electrode is formed to be closer to the boundary, the leak is further apt to occur.

Furthermore, in the process under the rule of smallness of 0.35 µm or less, typically a metal silicide is formed in the emitter diffusion layer to decrease the parasitic resistance of the diffusion layer. Accordingly, the conventional manufacturing method of semiconductor apparatus has a problem that, when silicide is formed in the emitter portion, the silicide becomes closer to the emitter-base junction, which increases the leakage current between the emitter and the base, and prevents the formation of silicide in the diffusion layer, wherein as described above, the formation of silicide is typical in the process under the rule of smallness.

Furthermore, when the electric field strength is high between the emitter and the base, electrons (hot carriers) having been accelerated by the electric field collide with the insulation film on the vase to cause a defect (trap level or the like) to occur. Another problem is that the recombination current increases centering on such a defect as the recombination center, and hFE in the forward bias decreases when the collector current is low (the low collector current state). Still another problem is that carriers are apt to be generated via a defect in the reverse bias, and the leakage current increases. Also, when carriers are captured by or released from the defect, a noise may occur.

Furthermore, when a conventional bipolar transistor has a circuit structure where the emitter is connected with an external terminal of the integrated circuit (for example, the emitter follower circuit), there is a problem that, when a surge voltage is applied to the emitter, it is susceptible to the electronic discharge (ESD) since the electric field concentrates on the small emitter portion.

As described above, when the electric field strength is high between the circumferential portion of the emitter and the base, various problems, such as the increase in the leakage current and occurrence of a defect, might occur. It also prevents the high-frequency characteristics of the bipolar transistor from being improved.

A further problem is that, when the ring-like polysilicon layer is in the floating state and a transistor is in the vicinity of a line through which a signal with a large amplitude voltage flows, it becomes easy for an external signal voltage to enter and appear as a noise component at the output terminal of the transistor.

It is therefore an object of the present invention to provide a high-performance semiconductor apparatus which can be easily introduced into the MOS process, reduces the leakage current (electric field strength) between the emitter and the base, and is insusceptible to noise or surge voltage, and a manufacturing method of the semiconductor apparatus.

Means for Solving the Problems

In one aspect of the present invention, the above object is fulfilled by a semiconductor apparatus, comprising: a collector layer formed in a semiconductor substrate; a base formed on the collector layer in the semiconductor substrate; an emitter having been formed above the collector layer via the base and being surrounded by the base except for an upper surface thereof; and a conductive film laminated on, with an insulation film therebetween, an upper surface of the semiconductor substrate above a circumference of the emitter and a part of the base that is adjacent to the emitter, the conductive film being electrically connected with a predetermined wiring, wherein the emitter includes: a first emitter area including an area above which the conductive film is not laminated; and a second emitter area being a remaining area of the emitter excluding the first emitter area, wherein the second emitter area is positioned under the conductive film, is sandwiched between the first emitter area and the base at least in an upper side of the semiconductor substrate, and is lower in density of impurities than the first emitter area.

In another aspect of the present invention, the above object is fulfilled by a method for manufacturing a semiconductor apparatus, comprising the steps of: forming an insulation film on a base conductive-type area formed on a collector layer in a semiconductor substrate; forming a conductive film having a predetermined shape on the insulation film; covering, with a resist film, an entire upper surface of the base conductive-type area so as to form an opening to which are exposed a part of the conductive film including at least a side surface of the conductive film, and a first emitter area which is an area of the base conductive-type area adjacent to the side surface of the conductive film; implanting a first impurity ion into the first emitter area and a second emitter area in a state where the resist film exists, wherein the first impurity ion differs in a conductive type from the base conductive-type area, and the second emitter area is adjacent to the first emitter area and is under a circumference of the conductive film; implanting a second impurity ion into the first emitter area in a state where the resist film exists, wherein the second impurity ion differs in a conductive type from the base conductive-type area, and the second impurity ion is higher in density of impurities than the first impurity ion; and forming, after the steps of implanting the first and second impurity ions, in a state where the resist film does not exist, an electrode which is electrically connected with the conductive film and connected with the emitter or the base, onto the first emitter area or a base area which is an area of the base conductive-type area excluding the first and second emitter areas.

Advantageous Effects of Invention (1) According to the semiconductor apparatus of the present invention, the impurity diffusion area, which is to be the emitter area, is formed such that a low impurity density emitter diffusion layer is formed in the circumference of the emitter area near the upper surface thereof. With this structure, the electric field strength, which occurs at the emitter-base junction, is lowered, and the leakage current is reduced when a reverse voltage is applied between the emitter and the base.

Also, since it lowers the strength of the electric field that occurs at the emitter-base junction, the structure can restrict the reduction of hFE that occurs when carriers, which have been accelerated by the electric field that occurs at the emitter-base junction, collide with the insulation film on the upper surface to cause a defect (trap level or the like) to occur, when a reverse voltage is applied between the emitter and the base, and thus the range of the reverse voltage between the emitter and the base can be extended.

Since the low impurity density portion occupies a smaller portion of the emitter diffusion layer than the high impurity density emitter diffusion layer, the reduction in hFE caused by reduction in the emitter Gummel number (impurity density×thickness of emitter diffusion layer) is on the level of no problem. Furthermore, since there is a low impurity density second emitter area in the circumference of the emitter, the junction capacitance between the emitter and the base is also reduced, and "ft" of the bipolar transistor is improved. In addition, since there is no change in the junction depth of the emitter diffusion layer or the width in the depth direction of the base area (base width), the breakdown voltage between the collector and the emitter is not reduced.

Also, even in the case where the emitter diffusion layer is made shallow in order to improve the high-frequency characteristics of the bipolar transistor, according to the above-described structure, the low impurity density emitter diffusion layer is present under the conductive film. This structure prevents the emitter electrode from being arranged in the vicinity of the emitter-base junction, and reduces the leakage current between the emitter and the base.

Furthermore, even if the metal silicide is formed in the emitter diffusion layer to reduce the parasitic resistance of the emitter diffusion layer, the metal silicide can be separated from the emitter-base junction by a sufficient distance, making it possible to reduce the leakage current between the emitter and the base.

Furthermore, since, in this structure, the strength of the electric field, which occurs at the emitter-base junction, is lowered in the vicinity of the surface of the emitter diffusion layer, the ESD tolerance is improved when the surge voltage is applied to the emitter.

In the conductive film, when the electric potential thereof is not fixed (when it is in the floating state) and a transistor is in the vicinity of a line through which a signal with a large amplitude voltage flows, an external signal voltage is apt to enter via the conductive film in the floating state, and appear as a noise component at the output terminal of the transistor. However, by fixing the conductive film to the predetermined wiring (the emitter electrode, the base electrode or the like), it is possible to reduce the entering of signals from other circuits, and reduce the noise of analog circuits.

Note that the first emitter area and the second emitter area may contain the same impurities, or different impurities. The conductive film may be in a ring-like shape surrounding the first emitter area in a plan view. Not limited to this, the conductive film may be in a shape of letter "U" or "E" or the like.

It should be noted here that the "ring-like" shape refers to a shape of a closed loop in a plan view. The ring-like shape may be, for example, a polygon such as a rectangle, a circle, or any other arbitrary shape.

(2) The above-described semiconductor apparatus of the present invention is manufactured by the semiconductor apparatus manufacturing method of the present invention. The manufacturing method of the present invention has a merit that it can easily be incorporated into the CMOS process since the emitter and the base are formed by ion implantation.

Also, it is possible to form the first and second emitter areas with a high accuracy because in this manufacturing method, the ion implantation is performed twice by changing the conditions for the ion implantation such as the implantation angle and the acceleration energy (also referred to as "implantation energy") by using the conductive film as a mask. It is also possible to suppress the increase of the number of steps by sharing the mask in the two ion implantation steps. Note that there are cases where the ion implantation is performed with an intention that the impurity ions pass through the conductive film.

(3) The above-described semiconductor apparatus of the present invention may further comprise an emitter electrode connected with an upper surface of the emitter, wherein the conductive film is electrically connected with the emitter electrode.

In the bipolar transistor, the base area is formed by the ion implantation and the thermal processing, and thus the surface density thereof becomes lower than the peak density of the base area. Especially, in the case of an NPN transistor in which boron (B) is used in the base area, since boron is drawn to the insulation film (for example, $SiO_2$) of the surface, the surface density is further decreased. Due to this, the depletion layer is apt to expand in the surface of the base area, and the recombination current occurs in the depletion layer via, for example, the surface state between the base and the conductive film, and the base current component increases in the vicinity of the surface. This causes hFE to be decreased in the low collector current state in the hFE-collector current characteristics.

According to the semiconductor apparatus of the present invention, since the conductive film is connected with the emitter electrode, the conductive film has the same electric potential as the emitter area. This restricts the occurrence of a depletion layer in the surface of the base area under the conductive film, and suppresses reduction of hFE in the low collector current state in the hFE-collector current characteristics (improves the linearity of hFE).

(4) The above-described semiconductor apparatus of the present invention may further comprise a base electrode connected with an upper surface of the base, wherein the predetermined wiring electrically connected with the conductive film is the base electrode.

When the conductive film is set to the same electric potential as the emitter, a capacitance component is present due to the insulation film between the conductive film and the base, and the capacitance component becomes the parasitic capacitance component between the emitter and the base. When the insulation film between the conductive film and the base is thin, the cutoff frequency of transistor (hereinafter referred to as "ft") is apt to be decreased due to the influence of the parasitic capacitance component.

When the conductive film is connected with the base electrode, the parasitic capacitance component by the insulation film between the conductive film and the base does not affect the high-frequency characteristics of transistor. This, accordingly, improves the "ft", especially the characteristics of the analog circuits that deal with high-frequency signals.

(5) In the above semiconductor apparatus, the base may include: a base body area positioned under the conductive film at least in an upper surface area of the semiconductor substrate; a base contact area which is higher in density of impurities than the base body area and is separated from the emitter by the base body area, wherein the base contact area includes: a first base contact area connected with the base electrode; and a second base contact area having been formed to be sandwiched, at least in the upper surface area of the semiconductor substrate, between the first base contact area and a part of the base body area that is under the conductive film, the second base contact area being lower in density of impurities than the first base contact area.

According to the above semiconductor apparatus, the area (second base contact) in the circumference of the base contact area is higher in density of impurities than the base body area. Thus, the base resistance, which is a sum of the resistance components of the base body area and the base contact area, is reduced, which makes it possible to reduce the thermal noise that is cased by the base resistance, and realize a low noise bipolar transistor.

Also, in the high impurity density base contact area, the density of impurities in the second base contact area, which is located in the circumference thereof, on the side under the conductive film, but is higher than that in the base body area. In this way, the second base contact area, which has higher density of impurities than the base body area, is present. This makes it possible to suppress reduction of the surface density in the base body area, and suppress reduction of hFE in the low collector current state in the hFE-collector current characteristics, improving the linearity of hFE. That is to say, it is possible to expand the collector current area which is small in the hFE change in the hFE-collector current characteristics.

Note that since the second base contact area is lower in density of impurities than the first base contact area that has the highest density, when the second base contact area and the emitter come near to each other, the breakdown voltage between the emitter and the base is reduced only slightly.

In the above semiconductor apparatus, the second base contact area may be a remaining area of the base contact area excluding the first base contact area.

(6) The above semiconductor apparatus may further comprise a MOS transistor which has been formed in an area of the semiconductor substrate that is different from an area in which the base is formed, the MOS transistor including a source, a drain, and a gate electrode, the source and the drain of the MOS transistor having a same conductive type as the emitter, each of the source and the drain includes: a body area including an area above which the gate electrode is not laminated; and a low impurity density area being lower in density of impurities than the body area and having been formed at a position under the gate electrode, and the first emitter area and the body area of each of the source and the drain have equivalent impurities and density of impurities, and the low impurity density area and the second emitter area have equivalent impurities and density of impurities.

In the above semiconductor apparatus, a high impurity density area (first emitter area) and a low impurity density area (second emitter area) in the emitter of the bipolar transistor and a high impurity density area (body area) and a low impurity density area in the drain/source of the MOS transistor have the same impurities and density of impurities. This makes it possible to form and load a high-performance bipolar transistor which has reduced the emitter-base junction leak, by adding a small number of steps into the manufacturing process of a CMOS transistor.

Furthermore, the step of forming the conductive film of the bipolar transistor and the insulation film under the conductive film can be used in common with the step of forming the gate electrode and the insulation film of the CMOS transistor. As a result, it is possible to form the high-performance bipolar transistor only by adding a very small number of steps into the manufacturing process of the CMOS transistor. This reduces the cost and prevents the CMOS transistor characteristics from being deteriorated.

(7) The above semiconductor apparatus may further comprise a MOS transistor which has been formed in an area of the semiconductor substrate that is different from an area in which the base is formed, the MOS transistor including a source, a drain, and a gate electrode, the source and the drain of the MOS transistor having a same conductive type as the base, each of the source and the drain includes: a body area including an area above which the gate electrode is not laminated; and a low impurity density area being lower in density of impurities than the body area and having been formed at a position under the gate electrode, and the first base contact area and the body area of each of the source and the drain have equivalent impurities and density of impurities, and the low impurity density area and the second base contact area have equivalent impurities and density of impurities.

In the above semiconductor apparatus, a high impurity density area (first base contact area) and a low impurity density area (second base contact area) in the base contact area of the bipolar transistor and a high impurity density area (body area) and a low impurity density area in the drain/source of the MOS transistor have the same impurities and density of impurities. As a result, it is possible to form the high-performance bipolar transistor which is excellent in hFE linearity and low in base resistance, only by adding a small number of steps into the manufacturing process of the CMOS transistor.

Furthermore, the step of forming the conductive film of the bipolar transistor and the insulation film under the conductive film can be used in common with the step of forming the gate electrode and the gate insulation film of the CMOS transistor. As a result, it is possible to form the high-performance bipolar transistor only by adding a very small number of steps into the manufacturing process of the CMOS transistor. This reduces the cost and prevents the CMOS transistor characteristics from being deteriorated.

(8) In the above semiconductor apparatus manufacturing method, in the step of implanting the first impurity ion, the first impurity ion may be implanted into the first and second emitter areas at a first implantation angle to a normal line of a main surface of the semiconductor substrate, and in the step of implanting the second impurity ion, the second impurity ion may be implanted into the first emitter area at a second implantation angle that is smaller than the first implantation angle.

According to the above manufacturing method, it is possible to form the first and second emitter areas easily with a high accuracy because in this manufacturing method, the ion implantation is performed twice by changing the implantation angle by using the conductive film as a mask.

The above semiconductor apparatus manufacturing method may further comprise the steps of: covering, with a second resist film, an entire upper surface of the base conductive-type area so as to form an opening to which are exposed a part of the conductive film including at least another side surface of the conductive film, and a first base contact area which is an area of the base area separated from the emitter area by an area under the conductive film; implanting a third impurity ion into the first base contact area and a second base contact area in a state where the second resist film exists, wherein the third impurity ion has a same conductive type as the base area, and the second base contact area is adjacent to the first base contact area and is under a circumference of the conductive film; and implanting a fourth impurity ion into the first base contact area in a state where the second resist film exists, wherein the fourth impurity ion has a same conductive type as the base area, and the fourth impurity ion is higher in density of impurities than the third impurity ion.

The above manufacturing method provides the semiconductor apparatus described in section (5) above. Also, it is possible to form the first and second base contact areas with a high accuracy because in this manufacturing method, the ion implantation is performed twice by changing the conditions for the ion implantation such as the implantation angle and the implantation energy by using the conductive film as a mask. It is also possible to suppress the increase of the number of steps by sharing the mask in the two ion implantation steps.

(10) In the above semiconductor apparatus manufacturing method, in the step of implanting the third impurity ion, the third impurity ion may be implanted into the first and second base contact areas at a third implantation angle to a normal line of a main surface of the semiconductor substrate, and in the step of implanting the fourth impurity ion, the fourth impurity ion may be implanted into the first base contact area at a fourth implantation angle that is smaller than the third implantation angle.

Also, according to the above manufacturing method, it is possible to form the first and second base contact areas easily with a high accuracy because in this manufacturing method, the ion implantation is performed twice by changing the implantation angle.

(11) In the above semiconductor apparatus manufacturing method, in the step of implanting the first impurity ion, the first impurity ion may be implanted into the first and second emitter areas at a same time as the first impurity ion is implanted into a part of a MOS transistor area, wherein the MOS transistor area is in the semiconductor substrate, equivalent in a conductive type with the base area, and different in position from the base area, the MOS transistor area including a gate electrode, the part of the MOS transistor area includes: a source body area and a drain body area between which an area under the gate electrode is located; and a low impurity density source area and a low impurity density drain area which are respectively adjacent to the source body area and the drain body area and are located under circumference of the gate electrode, and in the step of implanting the second impurity ion, the second impurity ion is implanted into the first emitter area at a same time as the second impurity ion is implanted into the source body area and the drain body area.

The above manufacturing method provides the semiconductor apparatus described in section (6) above. Furthermore, a high impurity density area (first emitter area) in the emitter and a high impurity density area (body area) in the drain/source of the MOS transistor can be formed at the same time, and a low impurity density area (second emitter area) in the emitter and a low impurity density area in the drain/source of the MOS transistor can be formed at the same time. This reduces the number of steps in the manufacturing process.

(12) In the above semiconductor apparatus manufacturing method, in the step of implanting the third impurity ion, the third impurity ion may be implanted into the first and second base contact areas at a same time as the third impurity ion is implanted into a part of a MOS transistor area, wherein the MOS transistor area is in the semiconductor substrate, has a reversed conductive type compared to the base area, and is different in position from the base area, the MOS transistor area including a gate electrode, the part of the MOS transistor area includes: a source body area and a drain body area between which an area under the gate electrode is located; and a low impurity density source area and a low impurity density drain area which are respectively adjacent to the source body area and the drain body area and are located under circumference of the gate electrode, and in the step of implanting the fourth impurity ion, the fourth impurity ion is implanted into the first base contact area at a same time as the fourth impurity ion is implanted into the source body area and the drain body area.

The above manufacturing method provides the semiconductor apparatus described in section (7) above.

Furthermore, a high impurity density area (first base contact area) in the base contact area and a high impurity density area (body area) in the drain/source of the MOS transistor can be formed at the same time, and a low impurity density area (second base contact area) in the base contact area and a low impurity density area in the drain/source of the MOS transistor can be formed at the same time. This reduces the number of steps in the manufacturing process.

(13) The above object is also fulfilled by a semiconductor apparatus, comprising: a collector layer formed in a semiconductor substrate; a base formed on the collector layer in the semiconductor substrate; an emitter having been formed above the collector layer via the base and being surrounded by the base except for an upper surface thereof; and a conductive film laminated on, with an insulation film therebetween, an upper surface of the semiconductor substrate above a circumference of the emitter and a part of the base that is adjacent to the emitter, the conductive film being electrically connected with a predetermined wiring, wherein the base includes: a base body area positioned under the conductive film at least in an upper surface area of the semiconductor substrate; a base contact area which is higher in density of impurities than the base body area and is separated from the emitter by the base body area, wherein the base contact area includes: a first base contact area connected with the base electrode; and a second base contact area having been formed to be sandwiched, at least in the upper surface area of the semiconductor substrate, between the first base contact area and a part of the base body area that is under the conductive film, the second base contact area being lower in density of impurities than the first base contact area.

The above semiconductor apparatus produces the function/effect by the second base contact area as explained in the section (5) above. The function/effect by the second base contact area can be obtained regardless of whether the second emitter area is present, and regardless of whether the conductive film is connected with the wiring.

The above semiconductor apparatus may include the MOS transistor described in the section (7) above. In the above semiconductor apparatus, the second base contact area may be a remaining area of the base contact area excluding the first base contact area.

(14) The above object is also fulfilled by a method for manufacturing a semiconductor apparatus, comprising the steps of: forming an insulation film on a base conductive-type area formed on a collector layer in a semiconductor substrate; forming a conductive film having a predetermined shape on the insulation film; forming an emitter in an emitter area in the base conductive-type area, the emitter area being an area adjacent to an area under the conductive film; covering, with a resist film, an entire upper surface of the base conductive-type area so as to form an opening to which are exposed a part of the conductive film including at least another side surface of the conductive film, and a first base contact area which is an area of the base area separated from the emitter area by an area under the conductive film; implanting a third impurity ion into the first base contact area and a second base contact area in a state where the second resist film exists, wherein the third impurity ion has a same conductive type as the base area, and the second base contact area is adjacent to the first base contact area and is under a circumference of the conductive film; and implanting a second impurity ion into the first base contact area in a state where the resist film exists, wherein the second impurity ion has a same conductive type as the base conductive-type area, and the second impurity ion is higher in density of impurities than the first impurity ion.

The above manufacturing method provides a semiconductor apparatus that produces the function/effect by the second base contact area as explained in the section (5) above. The function/effect by the second base contact area can be obtained regardless of whether the second emitter area is present, and regardless of whether the conductive film is connected with the wiring. Also, it is possible to form the first and second base contact areas with a high accuracy because in this manufacturing method, the ion implantation is performed twice by changing the conditions for the ion implantation such as the implantation angle and the implantation energy by using the conductive film as a mask. It is also possible to suppress the increase of the number of steps by sharing the mask in the two ion implantation steps. Note that there are cases where the ion implantation is performed with an intention that the impurity ions pass through the conductive film.

Note that the emitter area may be composed of an area under a circumference of the conductive film (corresponding to the second emitter area) and an area adjacent to the area under the circumference of the conductive film (corresponding to the first emitter area).

The above semiconductor apparatus manufacturing method may include, after the steps of implanting the first and second impurity ions, the step of forming, in a state where the resist film and the insulation film do not exist, an electrode electrically connected with the conductive film, onto the first emitter area or a base area which is an area of the base conductive-type area excluding the first and second emitter areas. Also, in the above semiconductor apparatus manufacturing method, in the step of implanting the third impurity ion, the first impurity ion may be implanted into the first and second base contact areas at a first implantation angle to a normal line of a main surface of the semiconductor substrate, and in the step of implanting the second impurity ion, the second impurity ion may be implanted into the first and second base contact areas at a second implantation angle to a normal line of a main surface of the semiconductor substrate, the second implantation angle being smaller than the first implantation angle. Furthermore, the above manufacturing method may be used to form the source and the drain of the MOS transistor recited in the section (12) above.

Note that the first impurity ion, the first impurity ion implantation step, and the first implantation angle correspond to the third impurity ion, the third impurity ion implantation step, and the third implantation angle recited in the steps (1) to (12) and the embodiments. Note also that the second impurity ion, the second impurity ion implantation step, and the second implantation angle correspond to the fourth impurity ion, the fourth impurity ion implantation step, and the fourth implantation angle recited in the steps (1) to (12) and the embodiments.

DESCRIPTION OF THE PREFERRED EMBODIMENTS

First Embodiment

Figure 1:
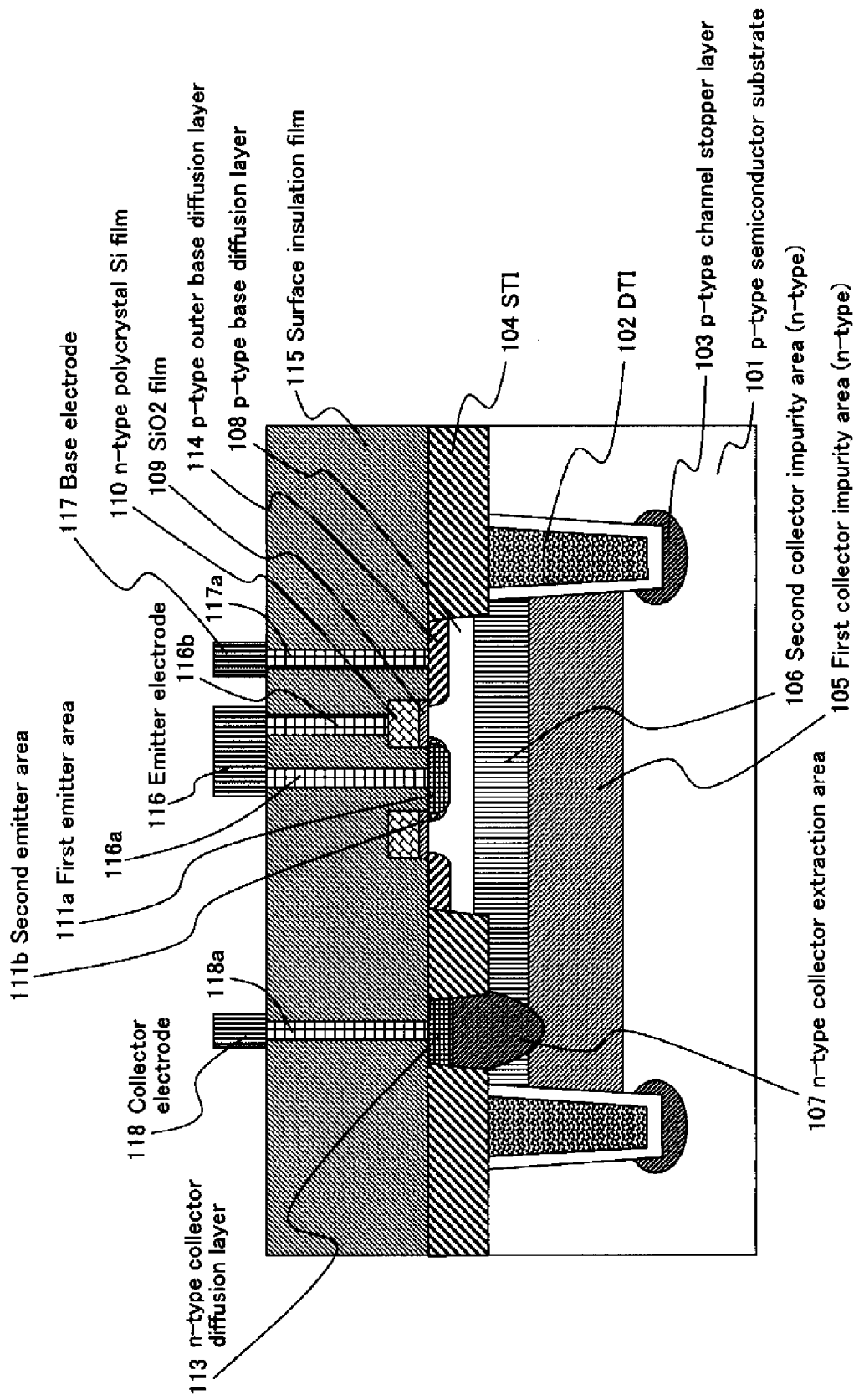
FIG. 1 is a cross-sectional view showing the semiconductor apparatus in the first embodiment.

The following describes a semiconductor apparatus and a manufacturing method thereof in the first embodiment of the present invention with reference to the attached drawings. FIG. 1 is a cross-sectional view showing the semiconductor apparatus in the first embodiment of the present invention. FIGS. 2 through 6 are cross-sectional views showing manufacturing steps of the semiconductor apparatus in the first embodiment shown in FIG. 1. Note that the first embodiment may be referred to as Embodiment 1 as well.

FIGS. 1 through 6 are cross-sectional views showing a vertical-type NPN bipolar transistor contained in the semiconductor apparatus and manufacturing steps thereof.

As shown in FIG. 1, in a p-type semiconductor substrate 101 composed of a silicon substrate, a deep trench isolation (DTI) 102 and a shallow trench isolation (STI) 104 are formed as a device separation area for separating the bipolar transistor from the other devices. A p-type channel stopper layer 103 is formed under the deep trench isolation (DTI) 102 to prevent the p-type semiconductor substrate 101 from being inverted to the n type.

(Collector Area, Base Area)

With reference to FIG. 1, a first collector impurity area (hereinafter referred to as "first collector area") 105 and a second collector impurity area (hereinafter referred to as "second collector area") 106, which are doped with n-type impurity, are formed in the area surrounded by the deep trench isolation 102 and the shallow trench isolation 104. Also, an n-type collector current extraction area (hereinafter referred to as "collector extraction area") 107 doped with a high impurity density n-type impurity is formed at a connection with a collector electrode, the collector extraction area 107 passing through the shallow trench isolation 104. An n-type collector diffusion layer (also referred to as "collector contact layer") 113, which is to be a collector contact area, is formed on the collector extraction area 107. A p-type base diffusion layer 108, which is to be a base area, is formed above the second collector area 106. A part of the upper surface of the p-type base diffusion layer 108 constitutes a part of a surface of the semiconductor substrate 101.

(Ring-Like Polycrystal Si Film and Others)

Figure 2:
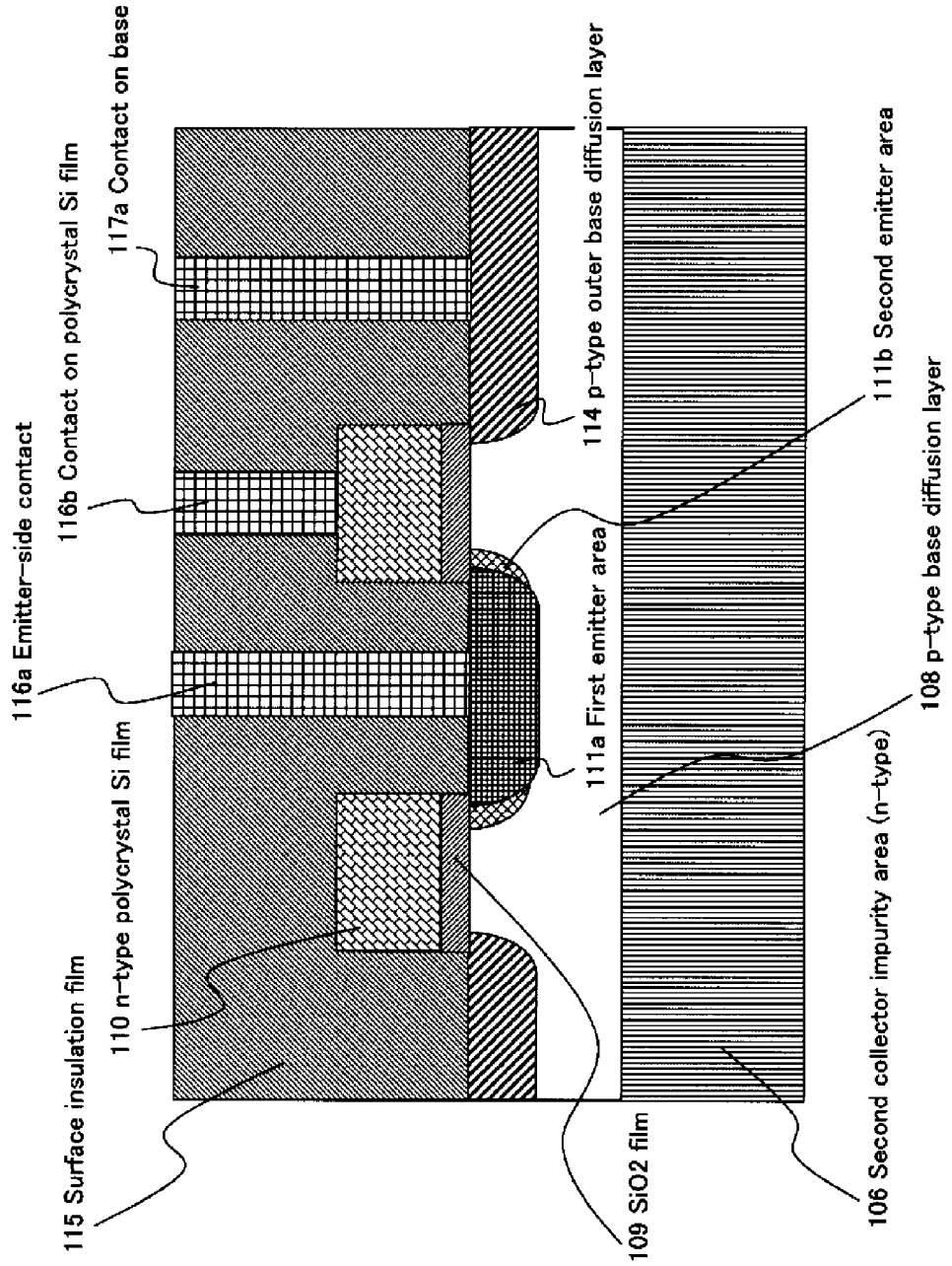
FIG. 2 is an enlarged view of a region around the emitter 111 of the semiconductor apparatus in the first embodiment.

FIG. 2 shows an enlargement of the region on the p-type base diffusion layer 108.

A $SiO_2$ film 109 (insulating film) and an n-type polycrystalline silicon (also referred to as "polycrystal Si") film 110 (conductive film) are formed on the p-type base diffusion layer 108. Here, the $SiO_2$ film 109 and the n-type polycrystal Si film 110 located on the p-type base diffusion layer 108 are ring-like in a plan view. In the cross-sectional view of FIG. 1, two cross-sections of the ring-like $SiO_2$ film 109 and n-type polycrystal Si film 110 are shown.

It should be noted here that the "ring-like" shape refers to a shape of a closed loop in a plan view. The ring-like shape may be, for example, a polygon such as a rectangle, a circle, or any other arbitrary shape.

(Emitter)

In the center of the upper surface of the p-type base diffusion layer 108, an emitter 111 is formed, surrounded by the $SiO_2$ film 109 and the n-type polycrystal Si film 110 (see FIG. 2).

More specifically, the circumferential portion of the emitter 111 is positioned under the n-type polycrystal Si film 110. The central portion of the emitter 111, which does not substantially overlap with the n-type polycrystal Si film 110 in a plan view, is composed of a first emitter area 111a. Note that the circumferential portion of the first emitter area 111a slightly extends to be under the n-type polycrystal Si film 110 (the first emitter area 111a has an area that is adjacent to an area under the n-type polycrystal Si film 110). The circumferential portion of the emitter 111, which is positioned under the $SiO_2$ film 109 and overlaps, in a plan view, with the n-type polycrystal Si film 110, is composed of a second emitter area 111b doped with a low impurity density n-type impurity.

(Base Contact)

In the circumferential portion of the p-type base diffusion layer 108, a p-type outer base diffusion layer 114, which is to be a base contact area and is doped with a high impurity density p-type impurity, is formed under a region which, in a plan view, surrounds the $SiO_2$ film 109 and the n-type polycrystal Si film 110.

(Electrode)

Furthermore, on the upper surface of the semiconductor apparatus shown in FIG. 1, a surface insulation film 115 (an insulation film covering the surface of the semiconductor substrate 101) composed of a $SiO_2$-base film is formed. An emitter electrode 116, a base electrode 117, and a collector electrode 118 are formed in the emitter area, the base contact area, and the collector contact area, respectively. The emitter electrode 116 is connected with the first emitter area 111a via an emitter-side contact 116a. Furthermore, the ring-like polycrystal Si film 110 is connected with the emitter electrode 116 via a contact 116b (contact plug).

The base electrode 117 is connected with the p-type outer base diffusion layer 114 via a base contact 117a. The collector electrode 118 is connected with the n-type collector diffusion layer 113 via a collector contact 118a.

<Manufacturing Method>

Next, a method for manufacturing the bipolar transistor explained with reference to FIGS. 1 and 2 will be explained in the following with reference to cross-sectional views of FIGS. 1 through 6 showing the manufacturing steps.

(Deep Trench Isolation)

Figure 3:
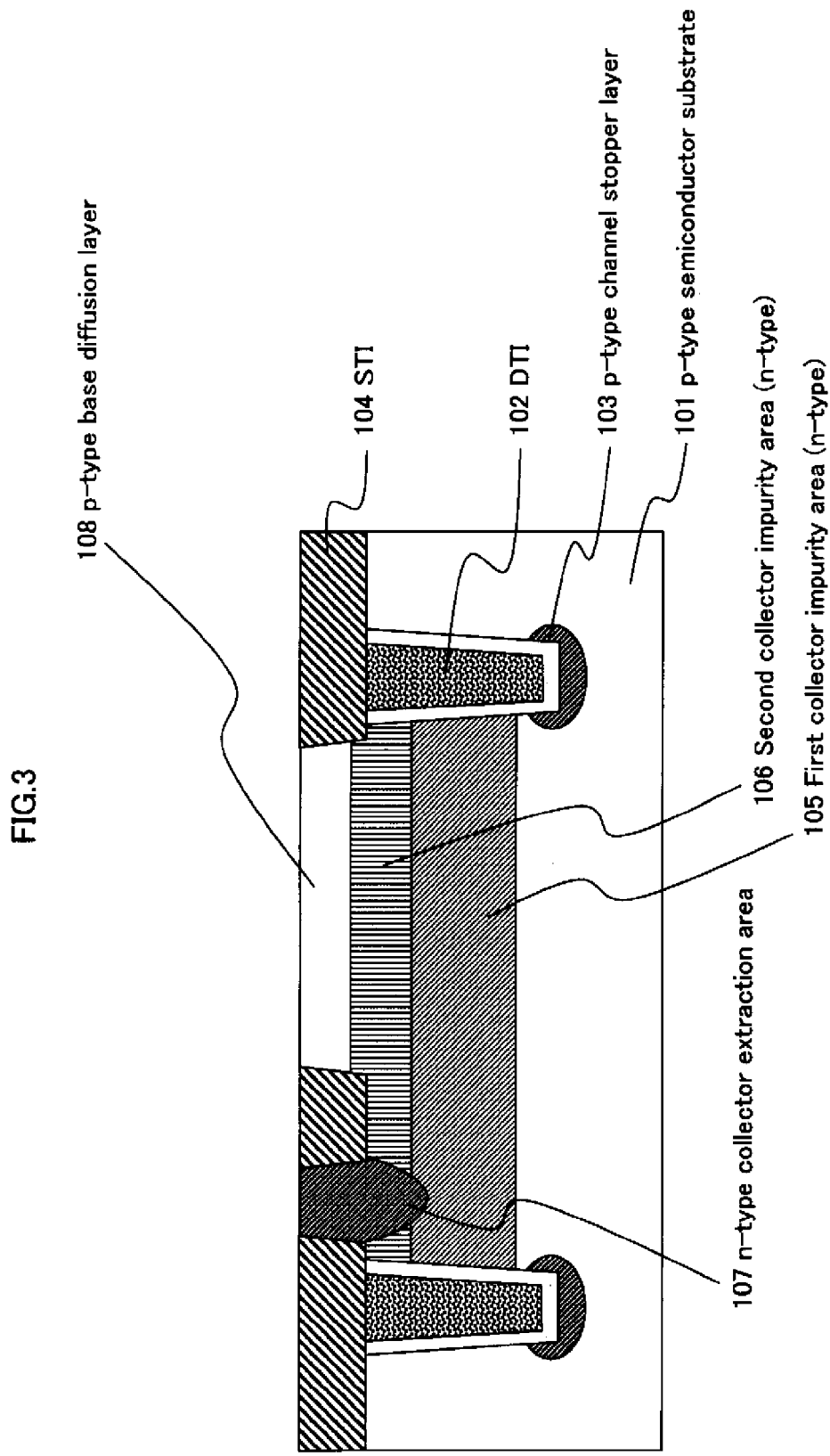
FIG. 3 is a cross-sectional view showing a manufacturing step of the semiconductor apparatus in the first embodiment.

As shown in FIG. 3, the deep trench isolation (DTI) 102 and the shallow trench isolation (STI) 104, as a device separation area for separating the bipolar transistor from the other devices, and the p-type channel stopper layer 103 are formed in the p-type semiconductor substrate 101. As the method for forming these, a known method for separating devices in the semiconductor device is applied.

The width of the deep trench isolation (DTI) 102 is in the range from 0.4 µm to 1.0 µm, and the depth thereof is in the range from 2 µm to 5 µm. The deep trench isolation (DTI) 102 is formed by etching to be sufficiently deeper than an area in which the first n-type collector impurity area 105 is formed as a collector.

After the trench etching, boron is implanted into only the bottom of the trench isolation to form the p-type channel stopper layer 103 there. The p-type channel stopper layer 103 prevents the p-type semiconductor substrate 101 from being inverted to the n type at the bottom of the trench isolation and being connected with the collector impurity area of the adjacent bipolar transistor. After this, a $SiO_2$ film with a thickness in the range from 100 nm to 200 nm is formed on the surface of the deep trench isolation by the thermal oxidation. The inside of the deep trench isolation is filled with a polysilicon film or a $SiO_2$ film which are formed by the Chemical Vapor Deposition (CVD) method.

(Shallow Trench Isolation)

After forming the deep trench isolation (DTI) 102, the shallow trench isolation (STI) 104 is formed in an area excluding the surroundings of the deep trench isolation and areas in which the p-type base diffusion layer 108 and the collector extraction area 107 are to be formed. The width of a portion of the shallow trench isolation (STI) 104 that surrounds the deep trench isolation (DTI) 102 in a plan view is greater than that of the deep trench isolation (DTI) 102 by a value in the range from 0.1 μm to 1.0 μm, and another portion of the shallow trench isolation 104 which is positioned between the p-type base diffusion layer 108 and the collector extraction area 107 is in the range from 0.4 μm to 2.0 μm. The depth of the shallow trench isolation (STI) 104 is in the range from 0.2 μm to 0.5 μm. The shallow trench isolation (STI) 104 is formed by etching.

After the shallow trench etching, a $SiO_2$ film with a thickness in the range from 5 nm to 50 nm is formed on the surface of the shallow trench isolation by the thermal oxidation. After this, the inside of the shallow trench isolation is filled with a $SiO_2$ film which is formed by the CVD method. The filling of the $SiO_2$ film into the shallow trench isolation is performed by the Chemical Mechanical Polishing (CMP) method which is typically used.

(Collector Area)

After this, the first collector impurity area 105 and the second collector area 106, which are to be a part of the collector area, are formed in an area surrounded by the deep trench isolation (DTI) 102 and the shallow trench isolation (STI) 104, by the ion implantation and thermal process. Also, the high impurity density collector extraction area 107 is formed in a portion connected with the collector electrode.

Here, with regard to the ion implantation of phosphorus (P) into the first collector area 105, the acceleration energy is set to be in the range from 800 keV to 1500 keV, and the amount of dose is set to be in the range from $1 \times 10^{12}$ pieces/cm$^2$ to $1 \times 10^{14}$ pieces/cm$^2$. Also, with regard to the ion implantation of phosphorus (P) into the second collector area 106, the acceleration energy is set to be in the range from 100 keV to 800 keV, and the amount of dose is set to be in the range from $1 \times 10^{12}$ pieces/cm$^2$ to $1 \times 10^{13}$ pieces/cm$^2$. Also, with regard to the ion implantation of phosphorus (P) into the collector extraction area 107, the acceleration energy is set to be in the range from 30 keV to 100 keV, and the amount of dose is set to be in the range from $1 \times 10^{14}$ pieces/cm$^2$ to $1 \times 10^{16}$ pieces/cm$^2$.

(Base Area)

The p-type base diffusion layer 108, which is to be the base area, is formed on the second collector area 106. Here, with regard to the ion implantation of boron (B) into the p-type base diffusion layer 108, the acceleration energy is set to be in the range from 20 keV to 100 keV, and the amount of dose is set to be in the range from $1 \times 10^{12}$ pieces/cm$^2$ to $1 \times 10^{14}$ pieces/cm$^2$.

In the present embodiment, the base conductive-type area is constituted from the p-type base diffusion layer 108 in the original state in which neither the emitter 111 nor the outer base diffusion layer 114 has been formed. The original p-type base diffusion layer 108 (base conductive-type area) is formed in an area between the second collector area 106 and a surface of the semiconductor substrate 101. The original p-type base diffusion layer 108 reaches the surface of the semiconductor substrate 101.

(Polycrystal Si Film and Others)

Figure 4:
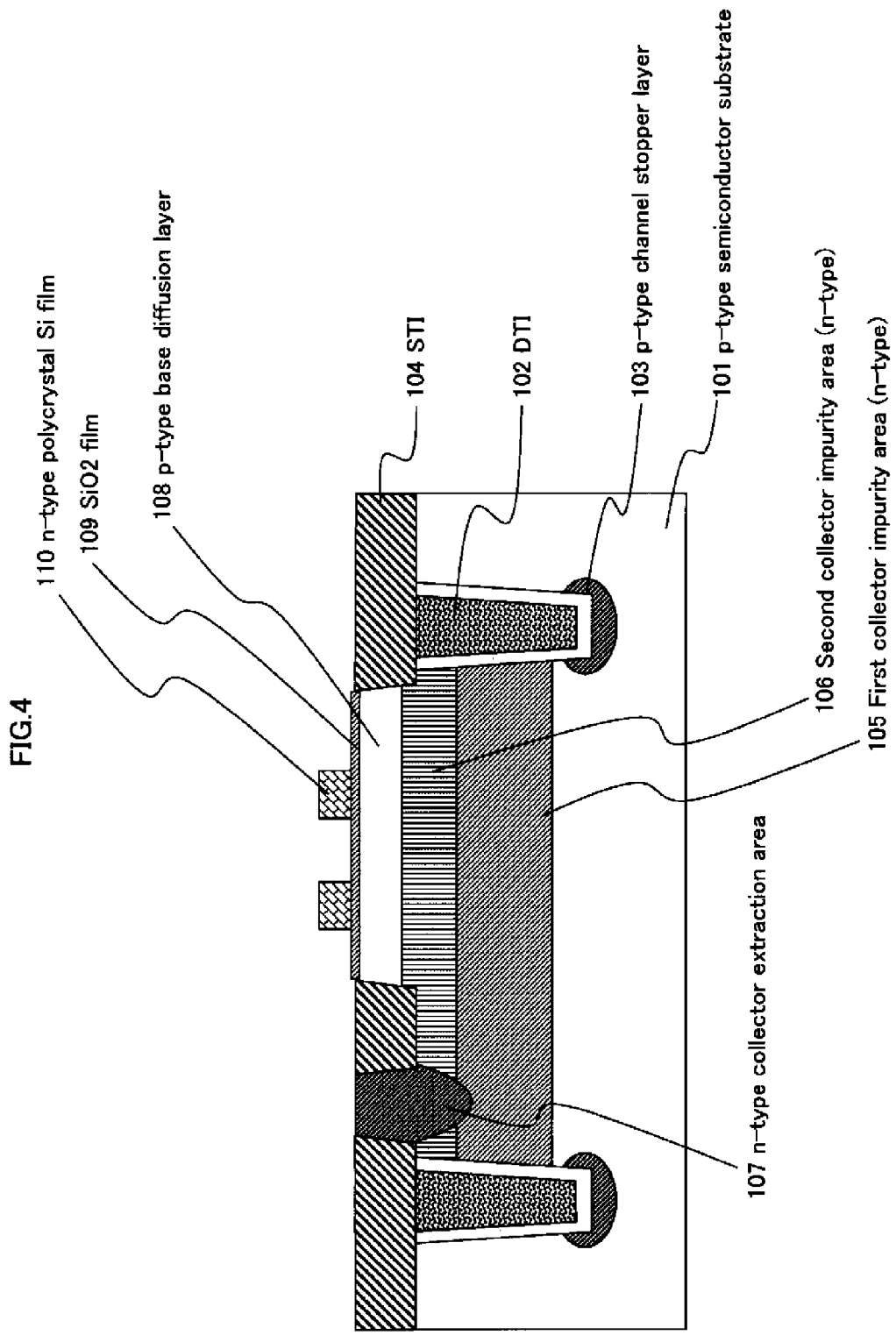
FIG. 4 is a cross-sectional view showing a manufacturing step of the semiconductor apparatus in the first embodiment.

Next, as shown in FIG. 4, the $SiO_2$ film 109 with a thickness in the range from 10 nm to 50 nm is formed on the p-type base diffusion layer 108 by the thermal oxidation. Then an n-type polycrystal Si film with a thickness in the range from 100 nm to 400 nm is deposited by the CVD method. And then a patterning is performed by the lithography method and the etching method, both known technologies. In this way, the n-type polycrystal Si film 110, which is ring-like when viewed in a plan view, is formed.

(Low Impurity Density Emitter Diffusion Layer)

Figure 5:
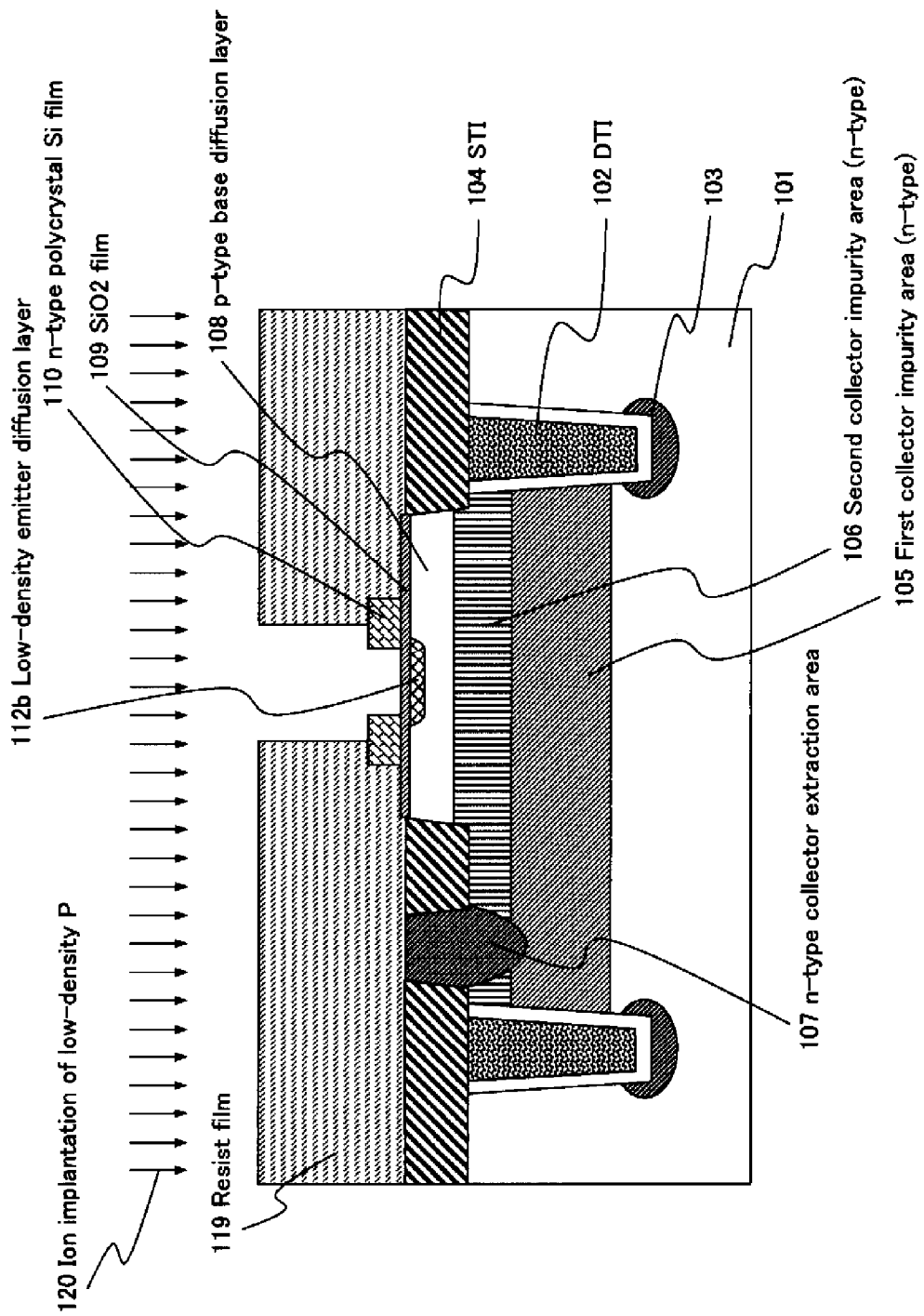
FIG. 5 is a cross-sectional view showing a manufacturing step of the semiconductor apparatus in the first embodiment.

Next, as shown in FIG. 5, a resist film 119 is formed by the lithography method so that an opening is formed, the opening including an inside of the ring-like n-type polycrystal Si film 110 and an area above approximately half of the ring-like n-type polycrystal Si film 110. Subsequently, a low impurity density emitter diffusion layer 112b is formed in an area under the inner space and inner circumferential part of the ring-like n-type polycrystal Si film 110 by performing an ion implantation 120 of a low impurity density phosphorus (P) at the first ion implantation angle (first ion implantation step).

Here, the inside of the n-type polycrystal Si film 110 refers to a part of the area above the p-type base diffusion layer 108 surrounded by the n-type polycrystal Si film 110. Also, the approximately half of the ring-like n-type polycrystal Si film 110 is an inner circumferential part of the ring-like n-type polycrystal Si film 110. More specifically, approximately half of the upper surface and the inner circumferential surface of the ring-like n-type polycrystal Si film 110 are exposed to the opening.

Here, in the ion implantation 120 of a low impurity density phosphorus (P), the acceleration energy is set to be in the range from 0.1 keV to 50 keV, the amount of dose is set to be in the range from $1 \times 10^{12}$ pieces/cm$^2$ to $9 \times 10^{14}$ pieces/cm$^2$, and the first ion implantation angle (first implantation angle) is set to be in the range from 7 degrees to 45 degrees, and with these settings, the low impurity density emitter diffusion layer 112b is formed even under the inner circumference of the ring-like n-type polycrystal Si film 110.

(High Impurity Density Emitter Diffusion Layer)

Figure 6:
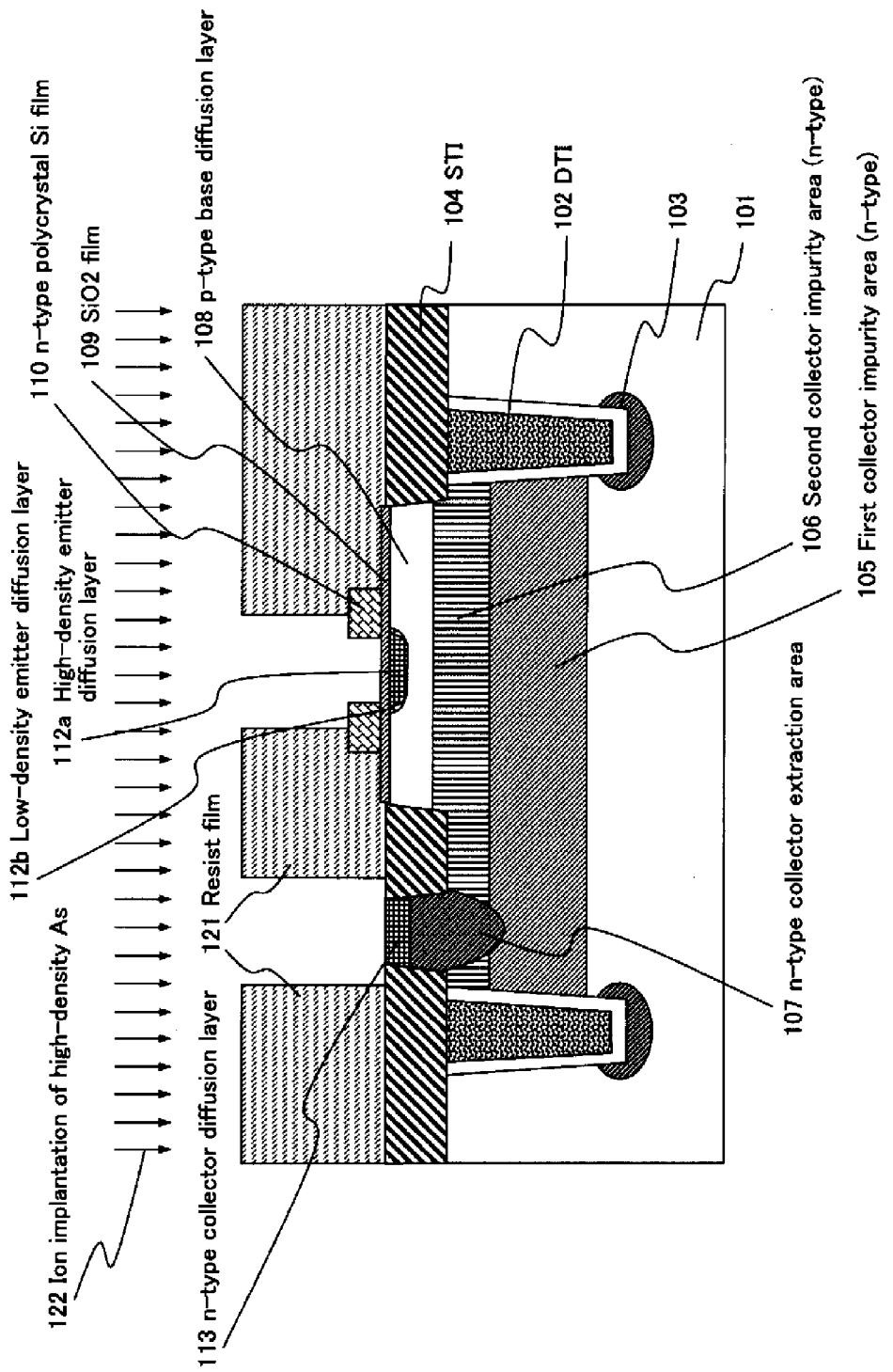
FIG. 6 is a cross-sectional view showing a manufacturing step of the semiconductor apparatus in the first embodiment.

Next, as shown in FIG. 6, a resist film 121 is formed by the lithography method to form two openings: an opening including an inside of the ring-like n-type polycrystal Si film 110 and an area above approximately half of the ring-like n-type polycrystal Si film 110; and an opening above the collector extraction area 107. After this, a high impurity density emitter diffusion layer 112a is formed in an area under the inner space of the ring-like n-type polycrystal Si film 110 by performing an ion implantation 122 of a high impurity density arsenic (As) at the second ion implantation angle (second implantation angle). Also, the n-type collector contact layer 113 is formed on the surface of the collector extraction area 107 (second ion implantation step).

Here, in the ion implantation 122 of a high impurity density As, the acceleration energy is set to be in the range from 10 keV to 80 keV, the amount of dose is set to be in the range from $1 \times 10^{15}$ pieces/cm$^2$ to $5 \times 10^{16}$ pieces/cm$^2$, and the second ion implantation angle is set to be in the range from 0 degrees to 10 degrees. With these settings, it is possible to form the high impurity density emitter diffusion layer 112a under the n-type polycrystal Si film 110 so that the layer 112a does not expand even after a thermal process after removing the resist film 121. And the low impurity density emitter diffusion layer 112b remains in the surroundings of the high impurity density emitter diffusion layer 112a. Note that, in the present embodiment, the first ion implantation angle is set to be larger than the second ion implantation angle.

The area in which the high impurity density emitter diffusion layer 112a is formed is referred to as "first emitter area 111a" (an area for the first emitter), and the area in which the low impurity density emitter diffusion layer 112b is formed without the high impurity density emitter diffusion layer 112a is referred to as "second emitter area 111b" (an area for the second emitter). Note that the thermal process may cause the outer appearances of the first emitter area 111a and the second emitter area 111b to expand than the outer appearances of the high impurity density emitter diffusion layer 112a and the low impurity density emitter diffusion layer 112b, respectively.

(Base Contact)

Figure 7:
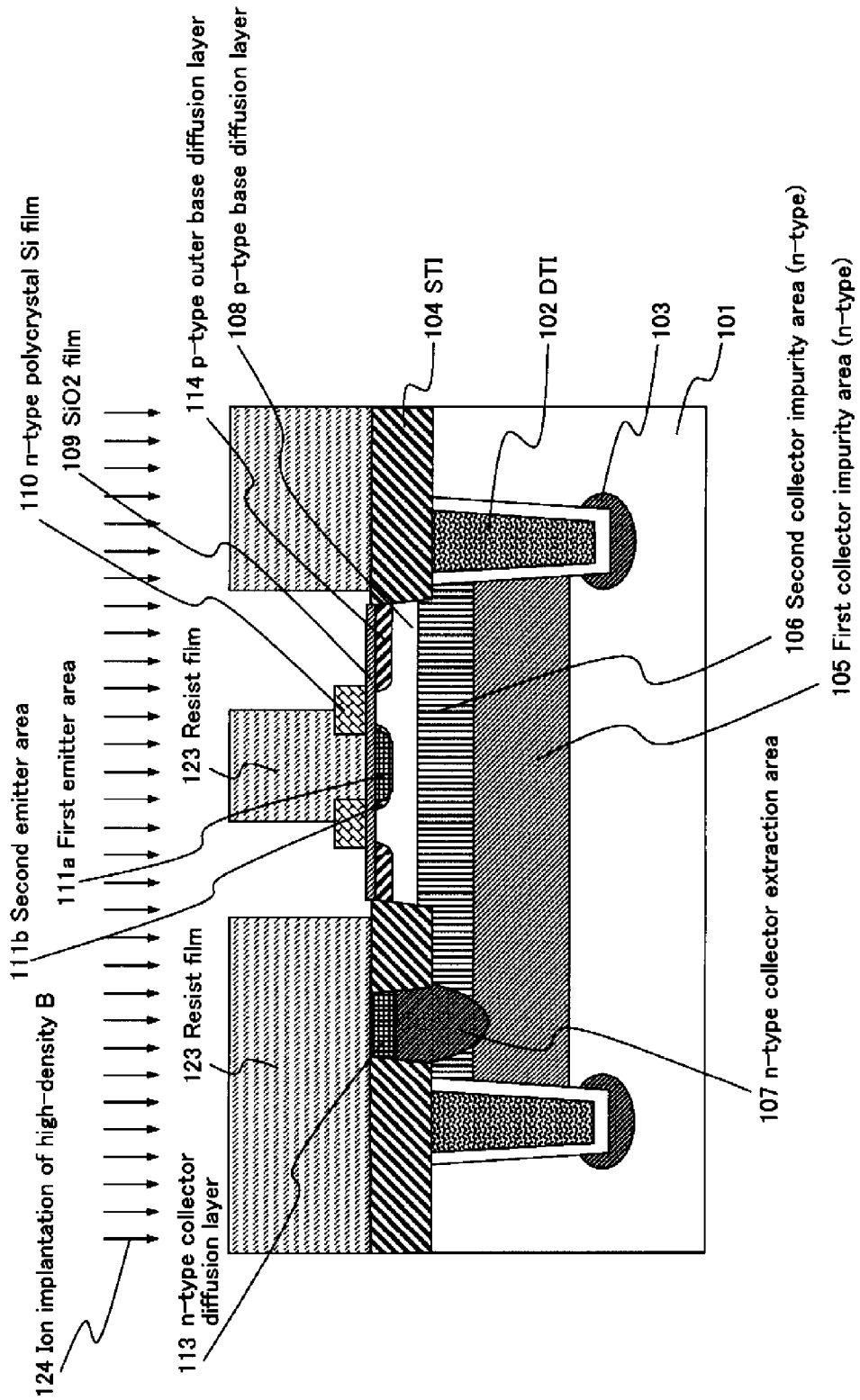
FIG. 7 is a cross-sectional view showing a manufacturing step of the semiconductor apparatus in the first embodiment.

Next, as shown in FIG. 7, a resist film 123 is formed by the lithography method so that an opening is formed, the opening including an outside of the ring-like n-type polycrystal Si film 110 and an area above approximately half of the ring-like n-type polycrystal Si film 110. Subsequently, the p-type outer base diffusion layer 114, which is to be the base contact area, is formed in an area outside the ring-like n-type polycrystal Si film 110 by performing the ion implantation 124 of a high impurity density boron (B). Here, in the ion implantation 124 of a high impurity density boron (B), the acceleration energy is set to be in the range from 10 keV to 80 keV, the amount of dose is set to be in the range from $1 \times 10^{15}$ pieces/cm$^2$ to $5 \times 10^{16}$ pieces/cm$^2$, and the ion implantation angle is set to be in the range from 0 degrees to 10 degrees.

Here, the outside of the n-type polycrystal Si film 110 refers to a part of the area above the p-type base diffusion layer 108 in the periphery of the n-type polycrystal Si film 110. Also, the approximately half of the ring-like n-type polycrystal Si film 110 is an outer circumferential part of the ring-like n-type polycrystal Si film 110. More specifically, approximately half of the upper surface and the outer circumferential surface of the ring-like n-type polycrystal Si film 110 are exposed to the opening.

In the present embodiment, the base area is constituted from the p-type base diffusion layer 108 in the state where the emitter 111 has been formed but the outer base diffusion layer 114 is yet to be formed. Also, the base body area is constituted from a portion of the p-type base diffusion layer 108 which is obtained by removing the emitter 111 and the p-type outer base diffusion layer 114 from the original p-type base diffusion layer 108. Furthermore, the "base" is constituted from the base body area and the p-type outer base diffusion layer 114.

(Thermal Process)

The thermal process is performed after the ion implantation 124 of boron is performed. Note that in general, the thermal process after the ion implantation 122 can be performed under the same conditions as those under which an ion implantation is performed to form the emitter or the like. This thermal process restores the crystal structure of the semiconductor substrate 101 (silicon structure), and activates the impurities doped into the semiconductor substrate 101.

In the present embodiment, the thermal process is performed only once for the ion implantations 120 through 124. This reduces the total number of steps in the manufacturing process. Note that a thermal process for the ion implantations 120 and 122 and a thermal process for the ion implantation 124 may be performed separately.

(Insulation Film, Electrode)

After this, as shown in FIG. 1, a surface insulation film 115 is deposited by the CVD method to cover the shallow trench isolation (STI) 104, the ring-like n-type polycrystal Si film 110, the high impurity density emitter diffusion layer 112a, the n-type collector contact layer 113, and the p-type outer base diffusion layer 114. Contact holes are formed through the surface insulation film 115 on the emitter 111, the base contact area (p-type outer base diffusion layer 114), a collector contact area (an area on the n-type collector diffusion layer 113), and the ring-like n-type polycrystal Si film 110, respectively. Contacts 116a, 116b and so on are formed in the contact holes, and the emitter electrode 116 and the base electrode 117 and the collector electrode 118 are formed on the contacts 116a, 116b and so on.

<Function, Effect and Others>

(1) According to the semiconductor apparatus and the manufacturing method thereof in the present embodiment, the impurity diffusion area, which is to be the emitter area, is formed such that a low impurity density emitter diffusion layer is formed in the circumference of the emitter area near the upper surface thereof. With this structure, the strength of the electric field, which occurs at the emitter-base junction, is lowered, and the leakage current is reduced when a reverse voltage is applied between the emitter and the base. Also, the structure restricts the reduction of hFE when a reverse voltage is applied between the emitter and the base, and thus the range of the reverse voltage between the emitter and the base can be extended.

(2) Since the low impurity density portion occupies a smaller portion of the emitter diffusion layer than the high impurity density emitter diffusion layer, the reduction in hFE caused by reduction in the emitter Gummel number (impurity density×thickness of emitter diffusion layer) is on the level of no problem. Furthermore, since there is a junction area of a low impurity density in the circumference of the emitter diffusion layer, the junction capacitance between the emitter and the base is also reduced, and "ft" of the bipolar transistor is improved. In addition, since there is no change in the junction depth of the emitter diffusion layer or the width in the depth direction of the base area (base width), the breakdown voltage between the collector and the emitter is not reduced.

(3) In the conductive ring-like n-type polycrystal Si film 110, when the electric potential thereof is not fixed (when it is in the floating state) and a transistor is in the vicinity of a line through which a signal with a large amplitude voltage flows, an external signal voltage is apt to enter via the ring-like n-type polycrystal Si film 110 in the floating state, and appear as a noise component at the output terminal of the transistor. However, by fixing the conductive ring-like n-type polycrystal Si film 110 to the emitter electric potential, it is possible to reduce the entering of signals from other circuits, and reduce the noise of analog circuits.

(4) According to the semiconductor apparatus and the manufacturing method thereof in the present embodiment, the conductive ring-like n-type polycrystal Si film 110 is connected with the emitter electrode via the contact 116b, and thus the ring-like n-type polycrystal Si film 110 and the emitter electrode have the same electric potential. For this reason, generation of a depletion layer is restricted in the surface layer of the p-type base diffusion layer under the ring-like n-type polycrystal Si film 110. This reduces the base current component in the vicinity of the surface of the base diffusion layer, which restricts the reduction of hFE in the low collector current state in the hFE-collector current characteristics.

(5) Even in the case where the emitter is made shallow in order to improve the high-frequency characteristics of the bipolar transistor, according to the present embodiment, the low impurity density second emitter area is present under the n-type polycrystal Si film 110. This structure prevents the emitter electrode from being arranged in the vicinity of the emitter-base junction, and reduces the leakage current between the emitter and the base.

(6) Furthermore, since, in this structure, the strength of the electric field, which occurs at the emitter-base junction, is lowered in the vicinity of the surface of the emitter 111, the ESD tolerance is improved when the surge voltage is applied to the emitter.

(7) A very small amount of low impurity density portion may be present in the circumference of the first emitter area 111a due to a diffusion or the like even if the second emitter area 111b is not formed. However, the formation of the second emitter area 111b creates differences in the change of the impurity density: for example, step-like differences or peaks are generated in the change of the impurity density.

Modification 1

Figure 8:
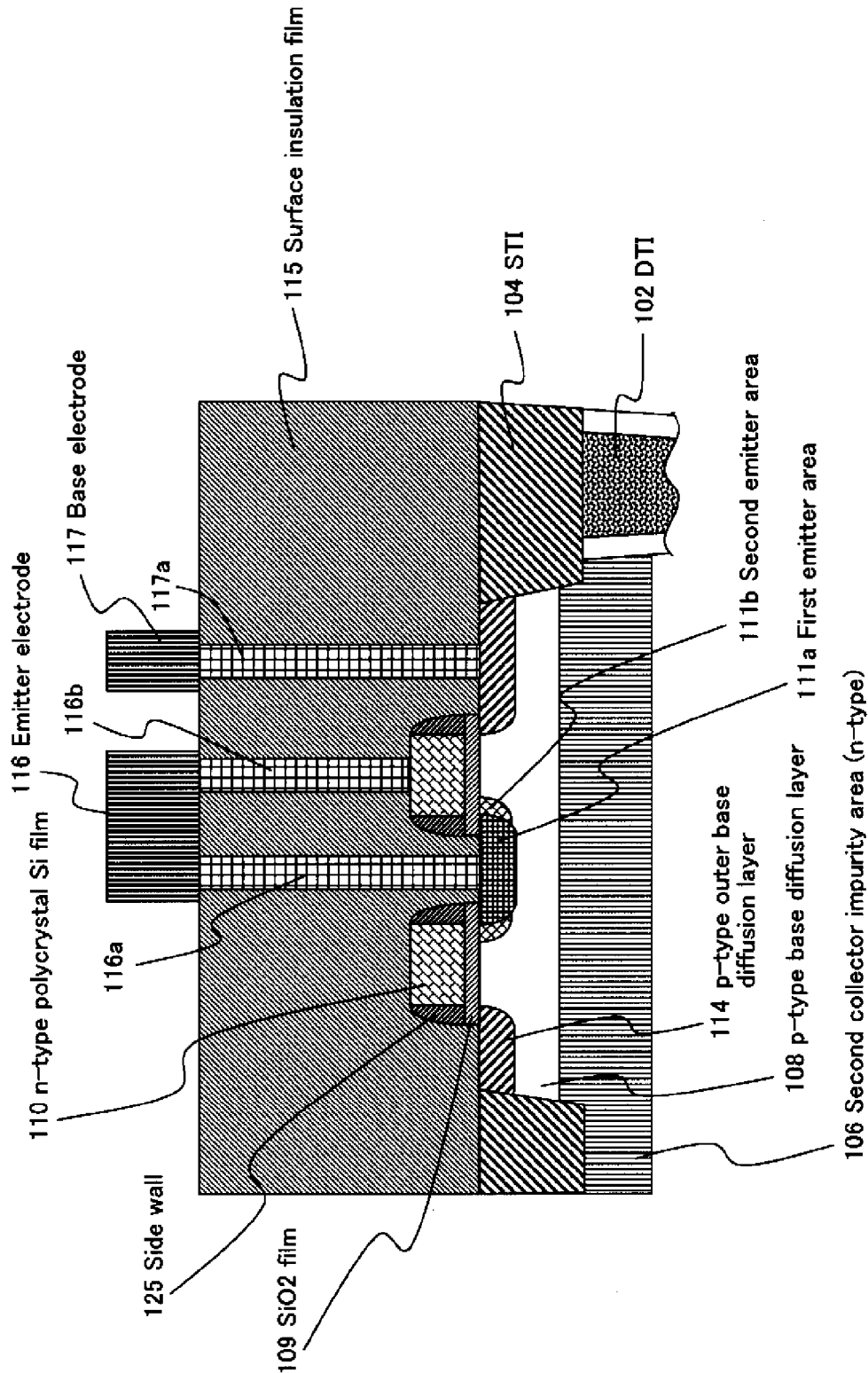
FIG. 8 is a cross-sectional view showing a part of the semiconductor apparatus in Modification 1 of the first embodiment.
Figure 9:
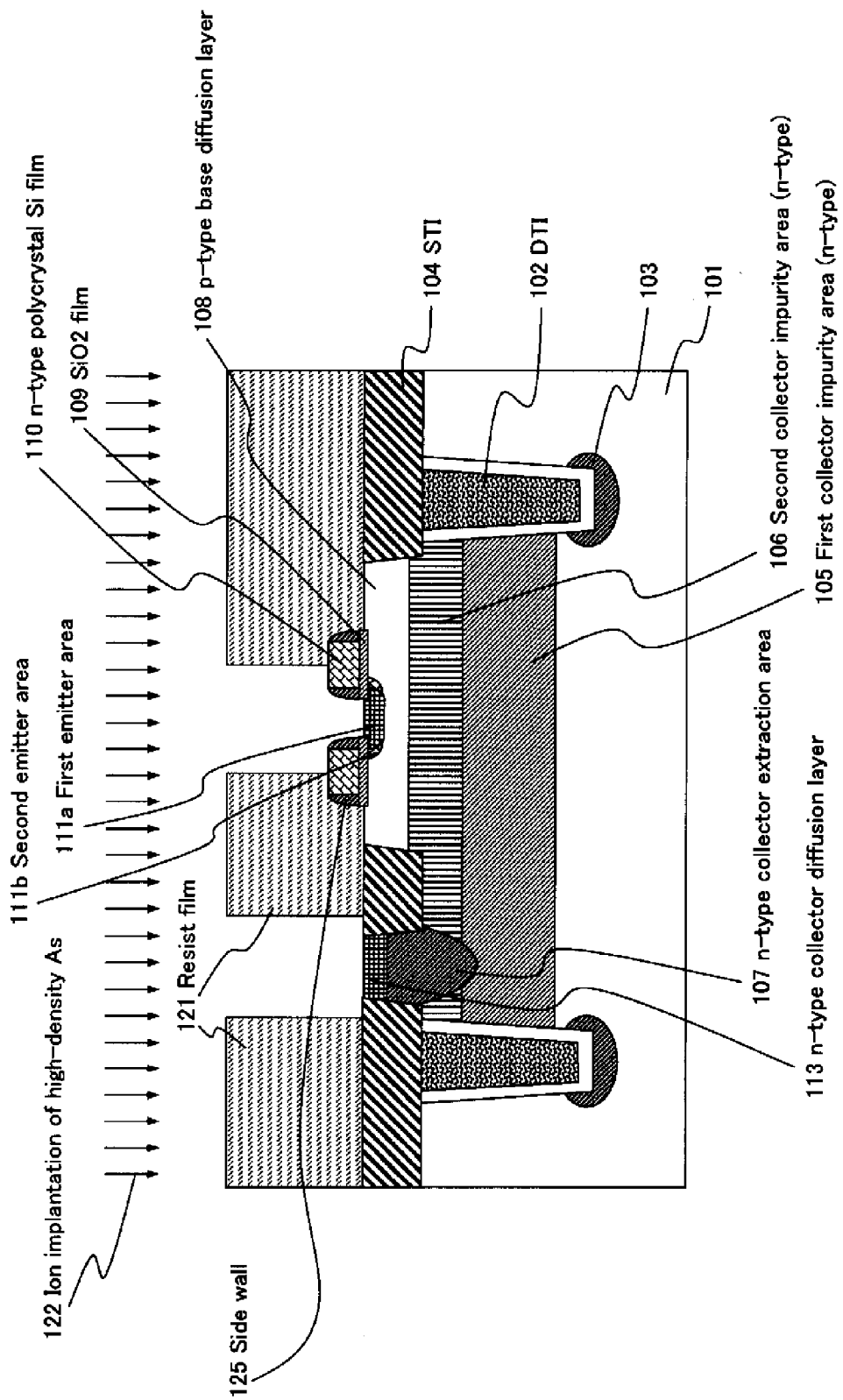
FIG. 9 is a cross-sectional view showing a manufacturing step of the semiconductor apparatus in the Modification 1.
Figure 10:
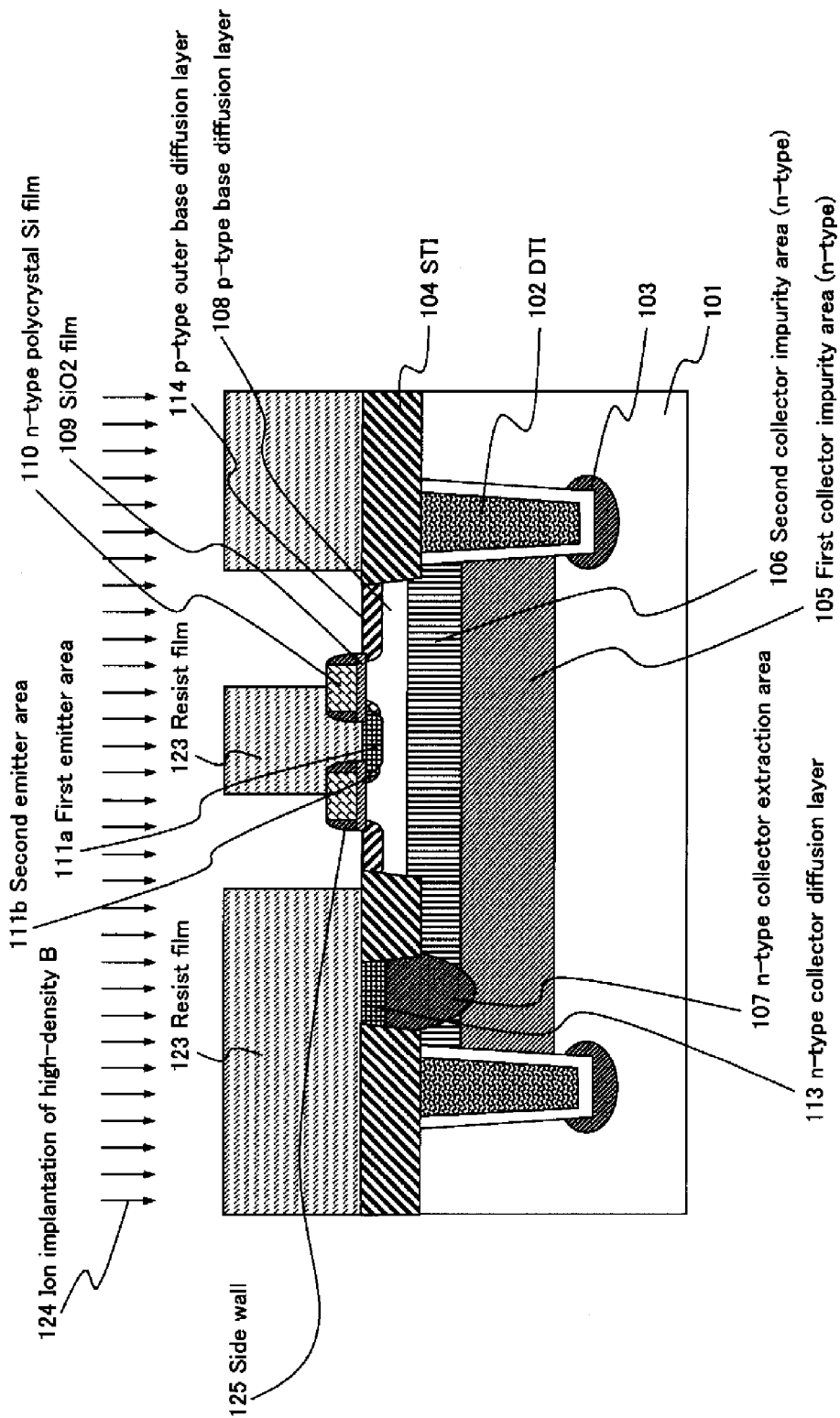
FIG. 10 is a cross-sectional view showing a manufacturing step of the semiconductor apparatus in the Modification 1.

The following describes a modification of the semiconductor apparatus and manufacturing method thereof in the first embodiment of the present invention with reference to the attached drawings. FIG. 8 is a cross-sectional view showing the semiconductor apparatus in the present modification. FIGS. 9 through 10 are cross-sectional views showing manufacturing steps of the semiconductor apparatus shown in FIG. 8. Note that the portions that are the same as the structural portions having been explained with reference to FIGS. 1 through 7 are attached the same reference signs and description thereof is omitted.

FIGS. 8 through 10 are cross-sectional views showing a vertical-type NPN bipolar transistor contained in the semiconductor apparatus of the present modification and manufacturing steps thereof.

As shown in FIG. 8, a side wall 125 made of an insulation film is formed on the sides of the n-type polycrystal Si film 110 which is provided on a ring-like $SiO_2$ film 109, and this is a difference from the structure shown in FIG. 1.

The side wall 125 formed on the inner side of the n-type polycrystal Si film 110 is located on the circumference of the first emitter area 111a. Also, the side wall 125 formed on the outer side of the n-type polycrystal Si film 110 is located on the inner circumference of the p-type outer base diffusion layer 114.

<Manufacturing Method>

The manufacturing method of the bipolar transistor shown in FIG. 8 has the same steps before the side wall 125 is formed as the manufacturing method shown in FIGS. 1 through 5. Accordingly, with regard to the manufacturing method after FIG. 5, the following provides an explanation with reference to the cross-sectional views of FIGS. 9 and 10 which show the manufacturing steps of the present embodiment.

(Formation of Side Wall)

After the low impurity density emitter diffusion layer 112b is formed as shown in FIG. 5, a surface insulation film, which is in the range from 30 nm to 200 nm in thickness, is deposited by the CVD method to cover the shallow trench isolation (STI) 104, the $SiO_2$ film 109, the ring-like n-type polycrystal Si film 110, the low impurity density emitter diffusion layer 112b, and the collector extraction area 107, and the side wall 125 is formed, by the etchback method which is a known technology, on the side surfaces of the ring-like n-type polycrystal Si film 110 as shown in FIG. 9. At this time, the $SiO_2$ film 109 is removed by etching except for the portion under the ring-like n-type polycrystal Si film 110 and the side wall 125.

(Formation of High Impurity Density Emitter Diffusion Layer and the Like)

Next, as shown in FIG. 9, a resist film 121 is formed by the lithography method to form two openings: an opening including an inside of the side wall 125 formed on the ring-like n-type polycrystal Si film 110 and an area above approximately half of the ring-like n-type polycrystal Si film 110; and an opening above the collector extraction area 107. Subsequently, an ion implantation 122 of a high impurity density arsenic (As) is performed to form the high impurity density emitter diffusion layer 112a in an area inside the ring-like n-type polycrystal Si film 110 and under the side wall 125, and to form the n-type collector diffusion layer 113 on the surface of the collector extraction area 107.

Here, in the ion implantation 122 of a high impurity density arsenic (As), the acceleration energy is set to be in the range from 10 keV to 80 keV, the amount of dose is set to be in the range from $5 \times 10^{14}$ pieces/cm$^2$ to $1 \times 10^{16}$ pieces/cm$^2$, and the ion implantation angle is set to be in the range from 0 degrees to 10 degrees. With these settings, it is possible to form the high impurity density emitter diffusion layer 112a under the ring-like n-type polycrystal Si film 110 so that the layer 112a does not expand even after a thermal process after removing the resist film 119, and the low impurity density emitter diffusion layer 112b remains in the circumference of the high impurity density emitter diffusion layer 112a.

(Formation of Base Contact)

Next, as shown in FIG. 10, a resist film 123 is formed by the lithography method to form an opening to which the outer circumferential surface of the side wall 125 formed on the outer side of the ring-like n-type polycrystal Si film 110, and approximately half of the upper surface of the ring-like n-type polycrystal Si film 110 are exposed, then an ion implantation 124 of a high impurity density boron (B) is performed, such that the p-type outer base diffusion layer 114, which is to be the base contact area, is formed in an area surrounding the ring-like n-type polycrystal Si film 110. Here, in the ion implantation 124 of a high impurity density boron (B), the acceleration energy is set to be in the range from 10 keV to 80 keV, the amount of dose is set to be in the range from $1 \times 10^{15}$ pieces/cm$^2$ to $5 \times 10^{16}$ pieces/cm$^2$, and the ion implantation angle is set to be in the range from 0 degrees to 10 degrees.

After this, as in the first embodiment, the surface insulation film 115, the contact 116b, the emitter electrode 116, the base electrode 117, and the collector electrode 118 are formed.

(Function/Effect)

According to the semiconductor apparatus and the manufacturing method thereof in the present modification, the emitter 111 is composed of: the low impurity density emitter diffusion layer 112b which is formed after the ring-like n-type polycrystal Si film 110 is formed; and the high impurity density emitter diffusion layer 112a which is formed after the side wall 125 is formed. With this structure, even if a variation occurs in the ion implantation steps of forming the two emitter diffusion layers 112a and 112b, the second emitter area 111b is formed with an accuracy in the circumference of the emitter 111 near the upper surface thereof (the second emitter area 111b is a portion of the low impurity density emitter diffusion layer 112b in which the high impurity density emitter diffusion layer 112a has not been formed). As a result, the structure of the present modification produces sufficiently the advantageous effects explained in the first embodiment, and reduces the variation in the transistor characteristics.

Modification 2

Figure 11:
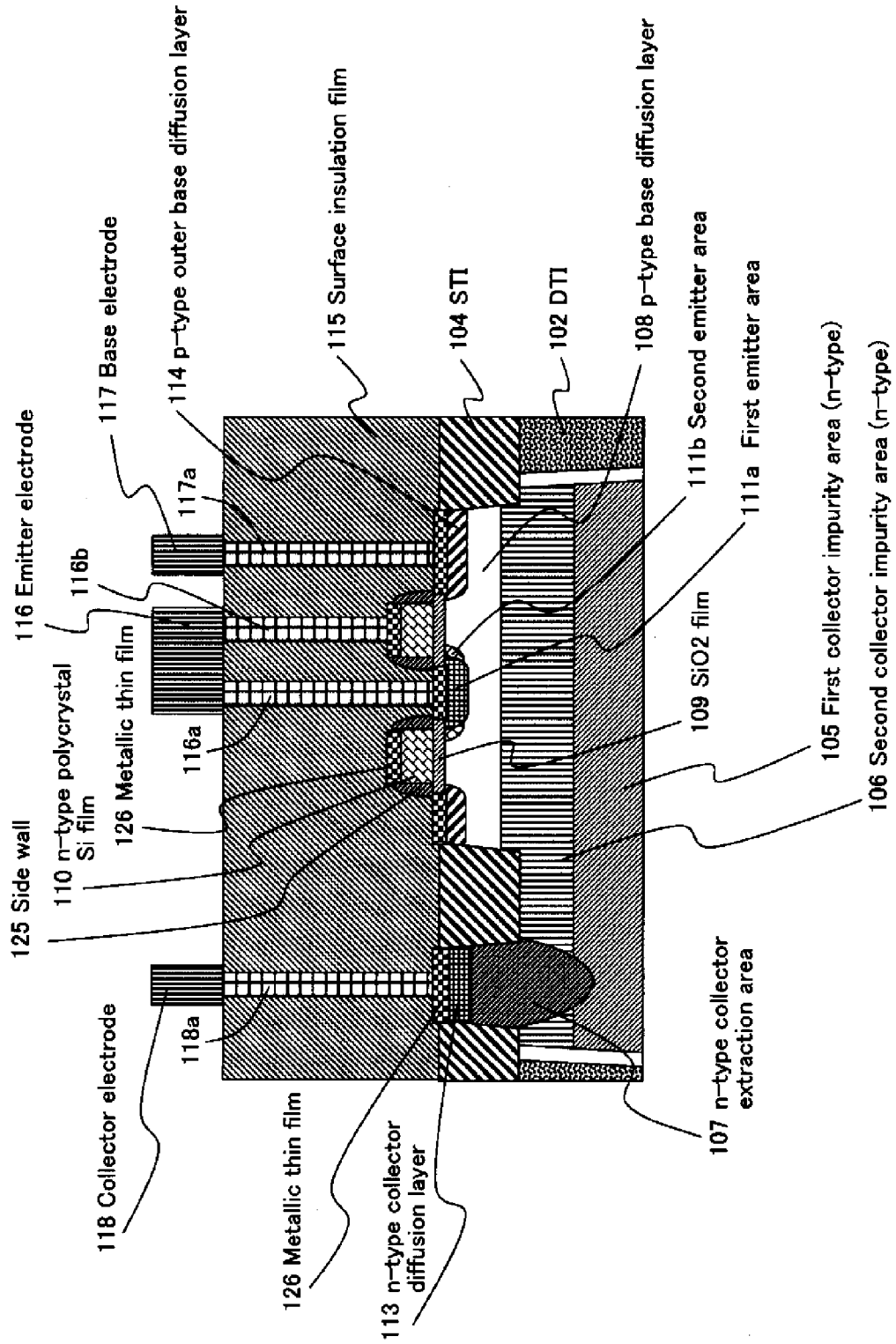
FIG. 11 is a cross-sectional view showing the semiconductor apparatus in Modification 2 of the first embodiment.
Figure 12:
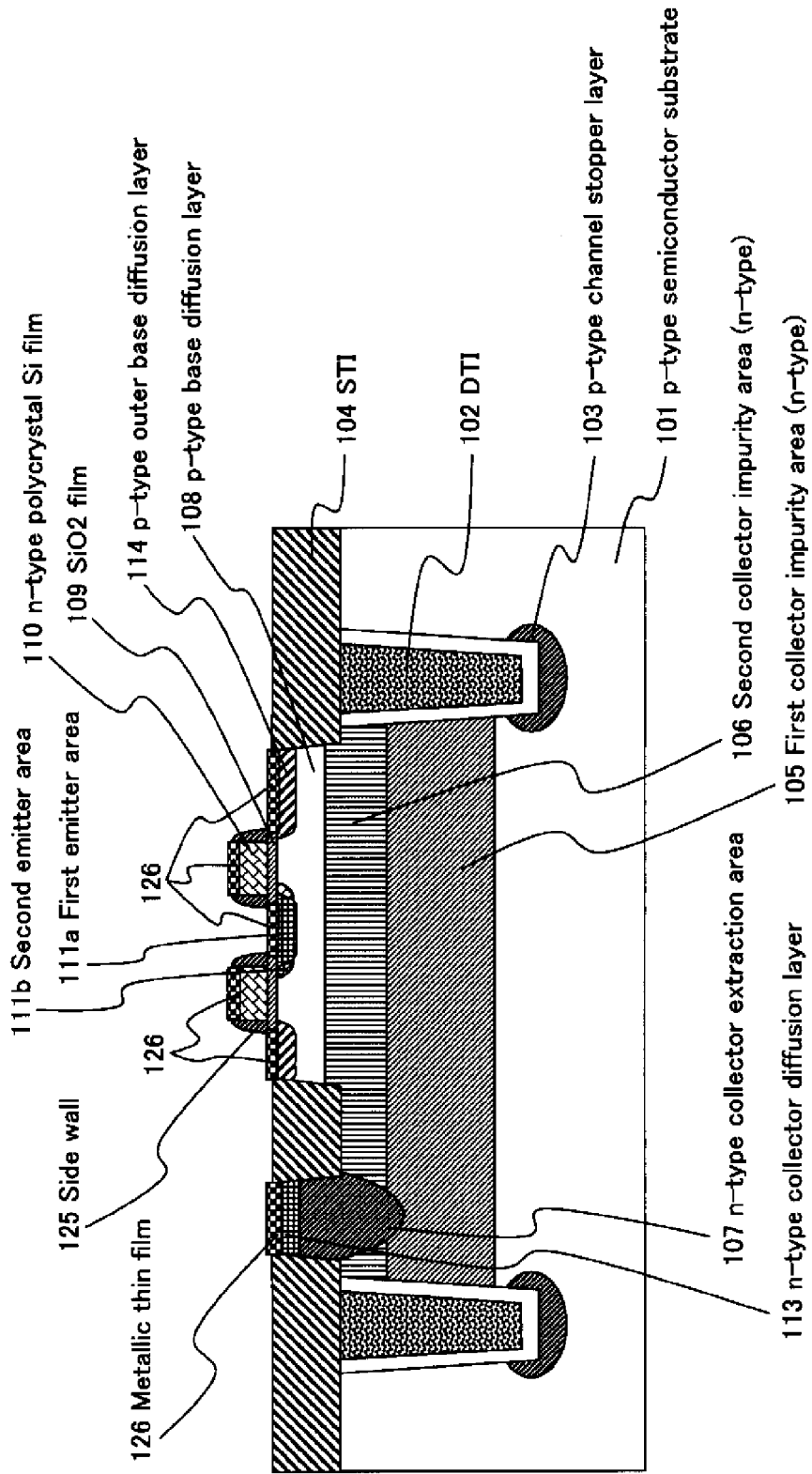
FIG. 12 is a cross-sectional view showing a manufacturing step of the semiconductor apparatus in the Modification 2.

The following describes another modification of the first embodiment of the present invention with reference to the attached drawings. FIG. 11 is a cross-sectional view showing the semiconductor apparatus in Modification 2 of the present invention. FIG. 12 is a cross-sectional view showing a manufacturing step of the semiconductor apparatus shown in FIG. 11. Note that the portions that are the same as the structural portions having been explained with reference to FIGS. 1 through 10 are attached the same reference signs and description thereof is omitted.

FIGS. 11 through 12 are cross-sectional views showing a vertical-type NPN bipolar transistor contained in the semiconductor apparatus and manufacturing steps thereof.

The structure shown in FIG. 11 is different from the structure shown in FIG. 8 in that a metallic thin film 126 (hereinafter also referred to as "metal silicide") is formed on an upper surface of each of the ring-like n-type polycrystal Si film 110, the high impurity density emitter diffusion layer 112a, the p-type outer base diffusion layer 114, and the n-type collector diffusion layer 113.

Furthermore, on the upper surface of the semiconductor apparatus shown in FIG. 11, a surface insulation film 115 composed of a SiO$_2$-base film is formed, and an emitter electrode 116, a base electrode 117, and a collector electrode 118 are formed in the emitter area, the base contact area, and the collector contact area, respectively. Also, on the metallic thin film 126, a contact 116b, which is connected with the emitter electrode 116, is formed.

<Manufacturing Method>

The manufacturing method of the bipolar transistor shown in FIG. 11 has the same steps before the metallic thin film 126 is formed as the manufacturing method shown in FIGS. 9 through 10. Accordingly, with regard to the manufacturing method after FIG. 10, the following provides an explanation with reference to the cross-sectional view of FIG. 12 which shows the manufacturing step of the present modification.

(Formation of Metallic Thin Film and Others)

As shown in FIG. 12, the p-type outer base diffusion layer 114, which is to be the base contact area, is formed, then the resist film 123 is removed, and then a refractory metal thin film composed of Ti or Co is deposited on the whole surface to cover the shallow trench isolation (STI) 104, the ring-like n-type polycrystal Si film 110, the side wall 125, the high impurity density emitter diffusion layer 112a, the n-type collector contact layer 113, and the p-type outer base diffusion layer 114, and then the metallic thin film 126 composed of an alloy of Ti and Si or an alloy of Co and Si is formed by the thermal process (also referred as "heat process") and the wet etching, which are both known technologies, on the surfaces of the ring-like n-type polycrystal Si film 110, the high impurity density emitter diffusion layer 112a, the n-type collector contact layer 113, and the p-type outer base diffusion layer 114, as shown in FIG. 11.

After this, as in the first embodiment, the surface insulation film 115, the contact 116b, the emitter electrode 116, the base electrode 117, and the collector electrode 118 are formed.

(Function/Effect)

According to the manufacturing method of the present modification, even if the metallic thin film 126 (metal silicide) is formed in the emitter diffusion layer to reduce the parasitic resistance of the emitter diffusion layer, the metal silicide can be separated from the emitter-base junction by a sufficient distance, making it possible to provide a semiconductor apparatus that can reduce the leakage current between the emitter and the base. Also, the structure improves the ESD tolerance when the surge voltage is applied to the emitter.

Modification 3

Figure 13:
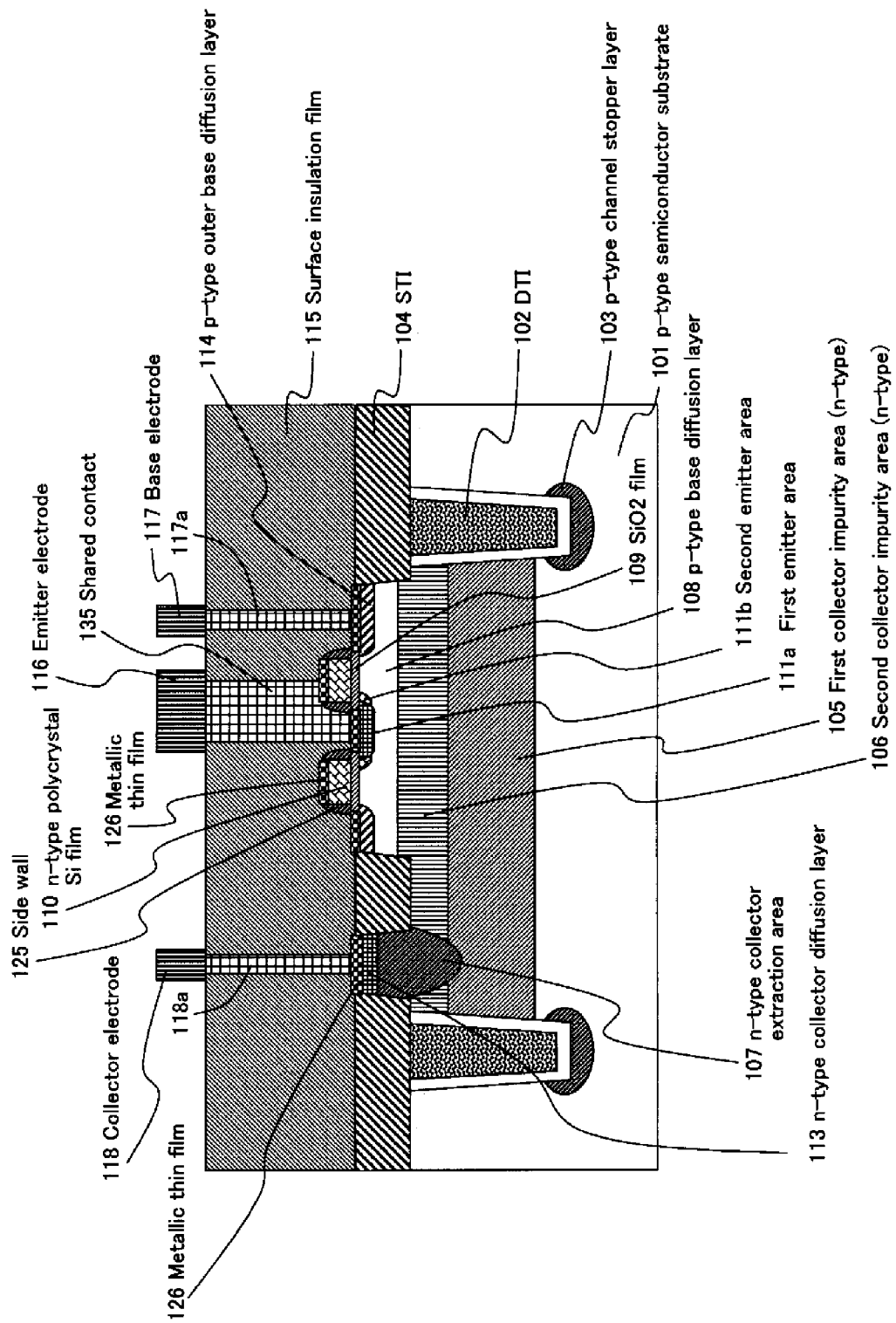
FIG. 13 is a cross-sectional view showing the semiconductor apparatus in Modification 3 of the first embodiment.

The following describes a semiconductor apparatus of the present modification with reference to the attached drawings. FIG. 13 is a cross-sectional view showing the semiconductor apparatus of the present modification. Note that the portions that are the same as the structural portions having been explained with reference to FIGS. 1 through 12 are attached the same reference signs and description thereof is omitted.

FIG. 13 is a cross-sectional view showing a vertical-type NPN bipolar transistor contained in the semiconductor apparatus.

As shown in FIG. 13, based on the structure explained in FIG. 1, a shared contact 135, which is in contact with the emitter diffusion layer and the n-type polycrystal Si film, is formed on the ring-like n-type polycrystal Si film 110 and the emitter 111. The shared contact 135 is formed as follows: a large-width contact hole is formed through the surface insulation film to reach respective parts of the n-type polycrystal Si film 110 and the emitter 111; and a conductive film is deposited in the contact hole.

<Function, Effect and Others>

According to the semiconductor apparatus and the manufacturing method thereof in the present modification, in addition to the advantageous effects having been explained in the embodiment and modifications so far, an advantageous effect that parasitic resistance components which exist in the contacts are reduced because the size of the contact (the area of the contact) between the emitter 111 and the emitter electrode 116 is large.

When the parasitic resistance component of the emitter portion becomes large, the gain of the analog circuit is reduced. Thus, to complement the reduction of the gain by the parasitic resistance, it becomes necessary to increase the circuit current. The structure of the present modification can, even in the process under the rule of smallness of 130 nm or less, reduce the parasitic resistance which exists in the emitter contact, and thus is effective in reducing the current consumption in the analog circuits.

Note that it is also possible to form a contact that covers respective parts of the n-type polycrystal Si film 110 and the p-type outer base diffusion layer 114.

Second Embodiment

Figure 14:
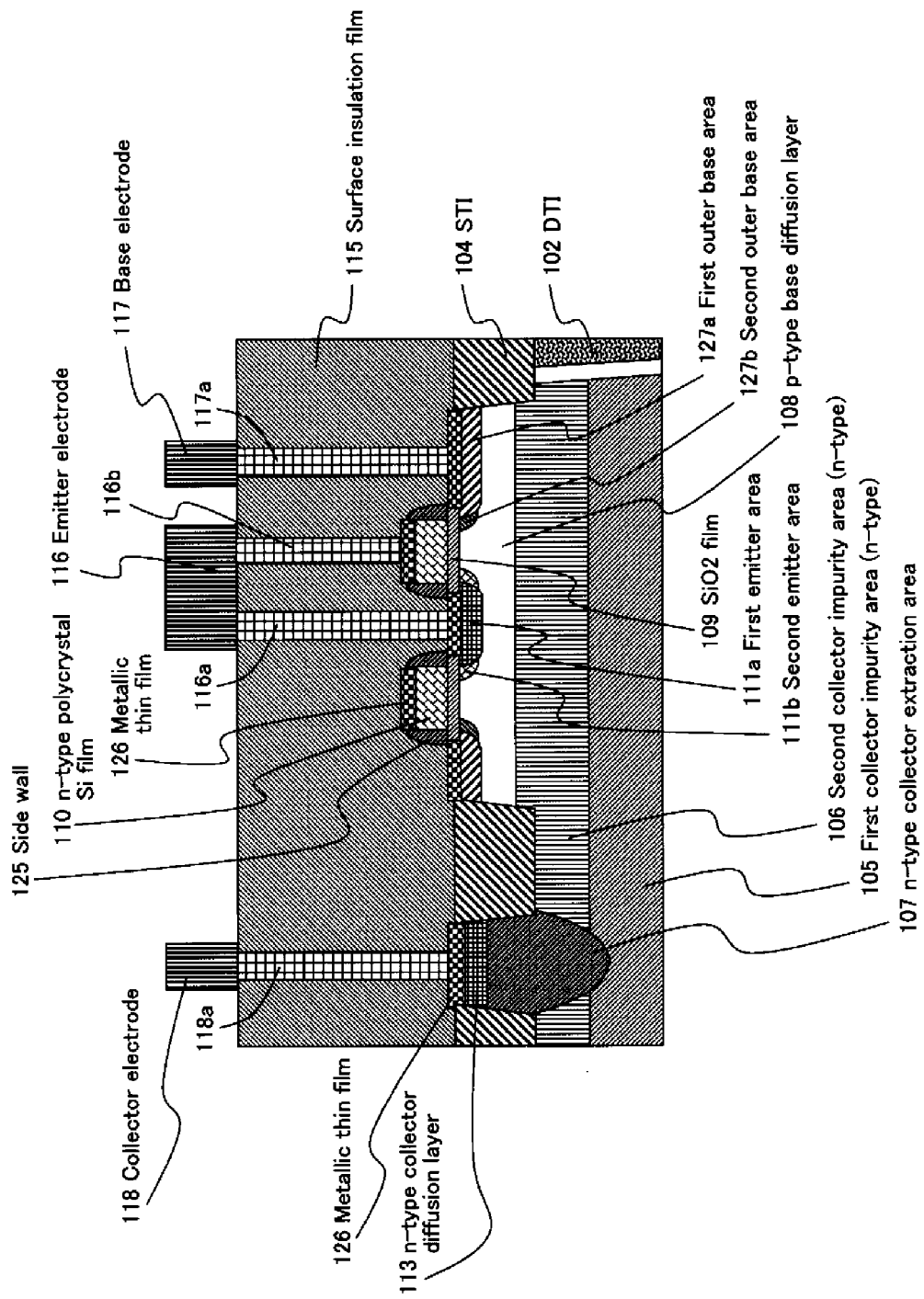
FIG. 14 is a cross-sectional view showing the semiconductor apparatus in the second embodiment.
Figure 15:
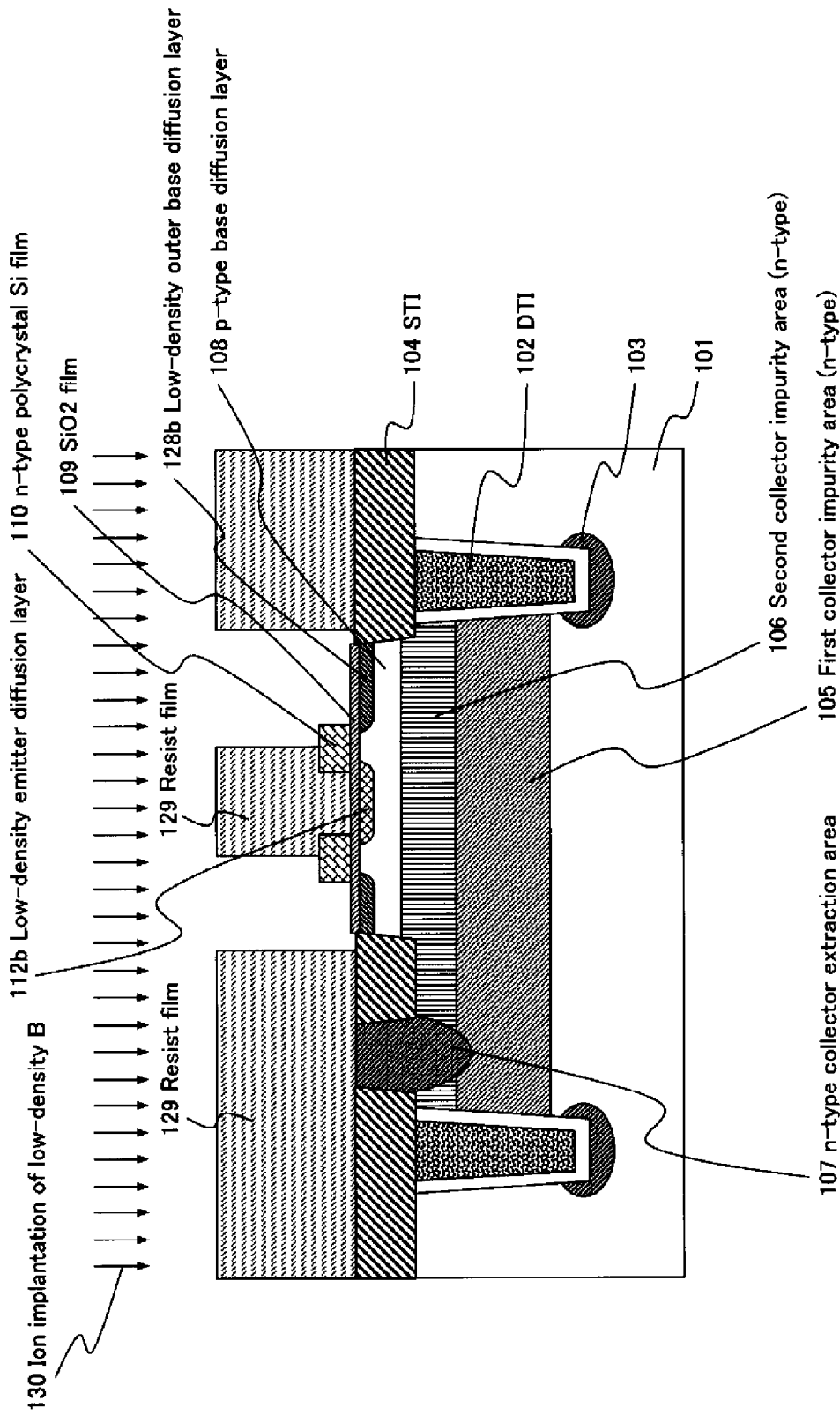
FIG. 15 is a cross-sectional view showing a manufacturing step of the semiconductor apparatus in the second embodiment.
Figure 16:
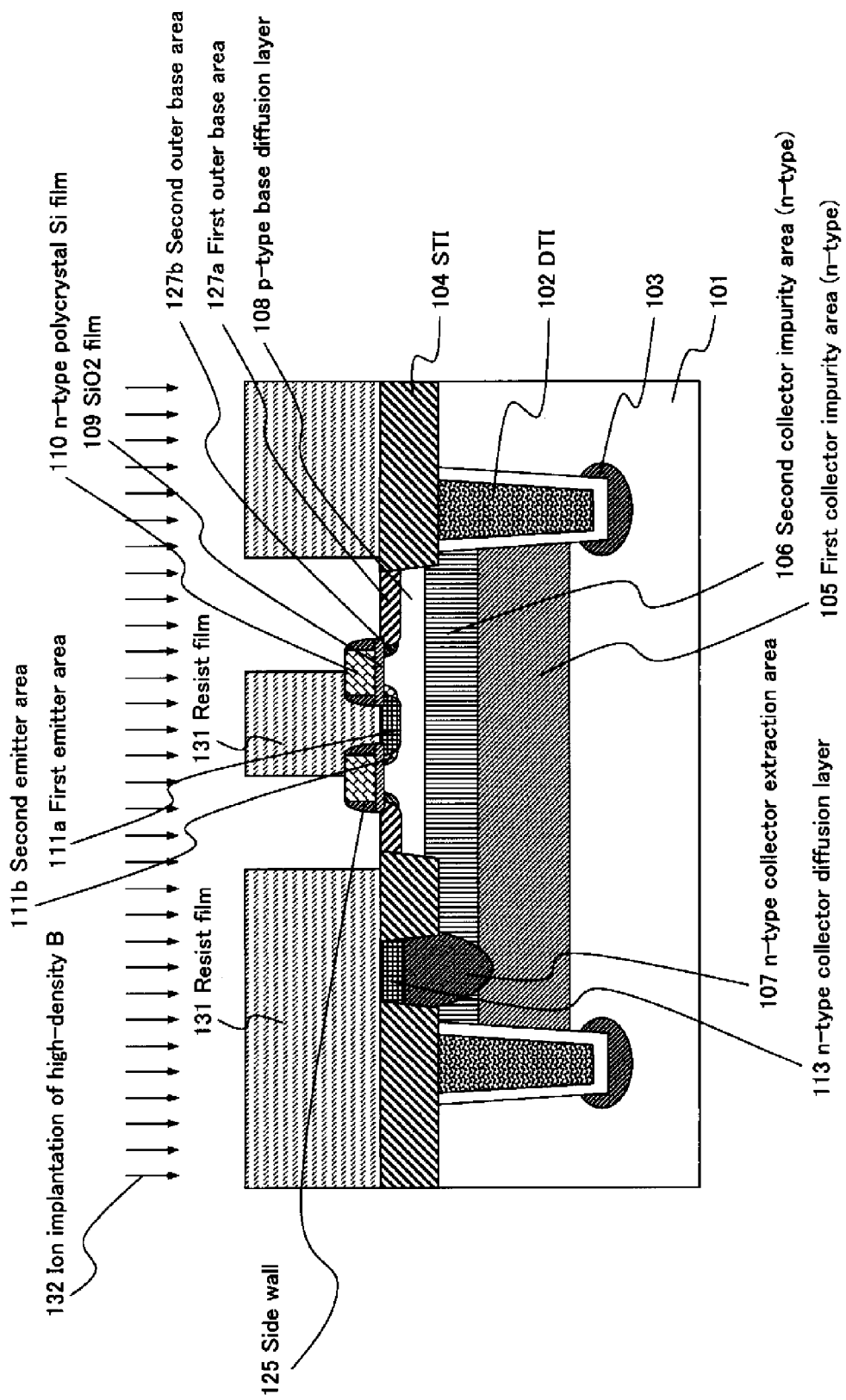
FIG. 16 is a cross-sectional view showing a manufacturing step of the semiconductor apparatus in the second embodiment.

The following describes a semiconductor apparatus and a manufacturing method thereof in the second embodiment of the present invention with reference to the attached drawings. FIG. 14 is a cross-sectional view showing the semiconductor apparatus in the second embodiment of the present invention. FIGS. 15 through 16 are cross-sectional views showing manufacturing steps of the semiconductor apparatus shown in FIG. 14. Note that the portions that are the same as the structural portions having been explained with reference to FIGS. 1 through 12 are attached the same reference signs and description thereof is omitted.

FIGS. 14 through 16 are cross-sectional views showing a vertical-type NPN bipolar transistor contained in the semiconductor apparatus and manufacturing steps thereof.

In the present embodiment, the outer base 127 (base contact area) includes a high impurity density first outer base area 127a (first base contact area) and a low impurity density second outer base area 127b (second base contact area). The first outer base area 127a is formed in an upper area of the p-type base diffusion layer 108 (base body area), and, in a plan view, in the peripheral of the ring-like SiO$_2$ film 109 and the ring-like n-type polycrystal Si film 110, which are located above the p-type base diffusion layer 108. The inner circumferential portion of the first outer base area 127a is located directly under the side wall 125. The second outer base area 127b is formed on the inner circumferential side of the first outer base area 127a, and is at least sandwiched between the surface layer of the first outer base area 127a and the surface layer of the p-type base diffusion layer 108. The upper surface layer of the first outer base area 127a and the upper surface layer of the p-type base diffusion layer 108 are separated by the second outer base area 127b. Also, the second outer base area 127b is formed in an area that is directly under the ring-like SiO$_2$ film 109, the ring-like n-type polycrystal Si film 110, and the side wall 125.

Here, the first outer base area 127a and the second outer base area 127b are each in a ring-like shape in a plan view.

It should be noted here that the "ring-like" shape refers to a shape of a closed loop in a plan view. The ring-like shape may be, for example, a polygon such as a rectangle, a circle, or any other arbitrary shape.

In the present embodiment, the outer base 127 is composed of the first outer base area 127a and the second outer base area 127b.

<Manufacturing Method>

The manufacturing method of the bipolar transistor shown in FIG. 14 has the same steps before the low impurity density p-type outer base diffusion layer 128b is formed as the manufacturing method shown in FIGS. 1 through 5. Accordingly, with regard to the manufacturing method after FIG. 5, the following provides an explanation with reference to the cross-sectional views of FIGS. 15 and 16 which show the manufacturing steps of the present embodiment.

(Low Impurity Density Outer Base Diffusion Layer)

After the low impurity density emitter diffusion layer 112b is formed as shown in FIG. 5, a resist film 119 is removed. Subsequently, as shown in FIG. 15, a resist film 129 is formed by the lithography method so that an opening is formed, the opening including an outside of the ring-like n-type polycrystal Si film 110 and an area above approximately half of the ring-like n-type polycrystal Si film 110 and so that the opening is within the p-type base diffusion layer 108 in a plan view. Subsequently, a low impurity density p-type outer base diffusion layer 128b (hereinafter referred to as "low impurity density outer base diffusion layer") is formed in an upper area of the p-type base diffusion layer 108, so as to be located, in a plan view, in an outer circumferential area of the ring-like n-type polycrystal Si film 110, by performing an ion implantation 130 of a low impurity density boron (B) at the third ion implantation angle (third implantation angle) (third ion implantation step).

Here, with regard to the ion implantation 130 of the low impurity density boron (B), the acceleration energy is set to be in the range from 0.1 keV to 50 keV, and the amount of dose is set to be in the range from $1 \times 10^{12}$ pieces/cm$^2$ to $9 \times 10^{14}$ pieces/cm$^2$, and the third ion implantation angle is set to be in the range from 7 degrees to 45 degrees, and with these settings, the low impurity density outer base diffusion layer 128b is formed even under the ring-like n-type polycrystal Si film 110.

(Formation of Side Wall, High Impurity Density Emitter Diffusion Layer)

Subsequently, as shown in FIG. 15, after the resist film 129 is removed, a surface insulation film is deposited by the CVD method in thickness ranging from 30 nm to 200 nm to cover the shallow trench isolation (STI) 104, the SiO$_2$ film 109, the ring-like n-type polycrystal Si film 110, the low impurity density emitter diffusion layer 112b, the collector extraction area 107, and the low impurity density outer base diffusion layer 128b, and then the side wall 125 is formed by the etch-back method, a known technology, on the side surface of the ring-like n-type polycrystal Si film 110 as shown in FIG. 15. At this time, the SiO$_2$ film 109 is removed by etching except for the portion under the ring-like n-type polycrystal Si film 110 and the side wall 125.

Subsequently, a high impurity density emitter diffusion layer 112a is formed in an area surrounded by the ring-like SiO$_2$ film 109, the ring-like n-type polycrystal Si film 110, and the side wall 125 and in an area under the side wall 125 (second implantation angle), and an n-type collector diffusion layer 113 is formed on the upper surface of the collector extraction area 107.

(Low Impurity Density Outer Base Diffusion Layer)

As shown in FIG. 16, a resist film 131 is formed by the lithography method so that an opening is formed, the opening including an outside of the ring-like n-type polycrystal Si film 110 and an area above approximately half of the ring-like n-type polycrystal Si film 110 and so that the opening is within the p-type base diffusion layer 108 in a plan view. Subsequently, a high impurity density p-type outer base diffusion layer 128a (hereinafter referred to as "high impurity density outer base diffusion layer") is formed in an upper area of the p-type base diffusion layer 108 so as to be located, in a plan view, in an outer circumferential area of the ring-like n-type polycrystal Si film 110, by performing an ion implantation 130 of a high impurity density boron (B) at the fourth ion implantation angle (fourth implantation angle) (fourth ion implantation step).

Here, in the ion implantation 132 of a high impurity density boron (B), the acceleration energy is set to be in the range from 10 keV to 80 keV, the amount of dose is set to be in the range from $1 \times 10^{15}$ pieces/cm$^2$ to $5 \times 10^{16}$ pieces/cm$^2$, and the fourth ion implantation angle is set to be in the range from 0 degrees to 10 degrees. With these settings, it is possible to form the high impurity density outer base diffusion layer 128a under the ring-like n-type polycrystal Si film 110 so that the layer 128a does not expand under the ring-like n-type polycrystal Si film 110 even after a thermal process after removing the resist film 131, and the low impurity density outer base diffusion layer 128b remains in the circumference of the high impurity density outer base diffusion layer 128a. Note that, in the present embodiment, the third ion implantation angle is set to be larger than the fourth ion implantation angle.

The area in which the high impurity density outer base diffusion layer 128a is formed is referred to as "first outer base area 127a", and the area in which the low impurity density outer base diffusion layer 128b is formed without the high impurity density outer base diffusion layer 128a is referred to as "second outer base area 127b".

(Thermal Process)

The thermal process is performed after the ion implantation 132 of boron is performed. Note that in general, the thermal process after the ion implantation 122 can be performed under the same conditions as those under which an ion implantation is performed to form the outer base or the like. This thermal process restores the crystal structure of the semiconductor substrate 101 (silicon structure), and activates the impurities doped into the semiconductor substrate 101.

In the present embodiment, the thermal process is performed only once for the ion implantations 120 through 132. This reduces the total number of steps in the manufacturing process. Note that a thermal process for the ion implantations 120 and 122 and a thermal process for the ion implantations 130 and 132 may be performed separately.

(Formation of Metallic Thin Film, Electrode and the Like)

Subsequently, as shown in FIG. 14, after the resist film 131 is removed, a metallic thin film 126a composed of an alloy of Ti and Si or an alloy of Co and Si is formed on the surfaces of the ring-like n-type polycrystal Si film 110, the first emitter area 111a, the first outer base area 127a (the high impurity density outer base diffusion layer 128a) and the like. After this, as in the first embodiment, the surface insulation film 115, the contact 116b, the emitter electrode 116, the base electrode 117, and the collector electrode 118 are formed.

<Function, Effect and Others>

(1) In the semiconductor apparatus of the present embodiment, the low impurity density second outer base area 127b is formed on the inner circumferential side of the high impurity density first outer base area 127a. This structure enables the second outer base area 127b to be closer to the emitter 111 than the first outer base area 127a when only the first outer base area 127a is formed. Since the second outer base area 127b is higher in density of impurities than the p-type base diffusion layer 108, it is possible to reduce the base resistance which is a sum of resistance components of the p-type base diffusion layer 108 and the outer base areas 127a and 127b. This results in reduction of the thermal noise which is caused by the base resistance, and a low-noise bipolar transistor is realized.

(2) In the semiconductor apparatus of the present embodiment, the second outer base area 127b, which is formed on the inner circumferential side of the first outer base area 127a, is higher in density of impurities than the p-type base diffusion layer 108. With this structure, the second outer base area 127b suppresses reduction of the surface density of the base. As a result, it is possible to suppress reduction of hFE in the low collector current state in the hFE-collector current characteristics, and to improve the linearity of hFE.

(3) In the semiconductor apparatus of the present embodiment, the second outer base area 127b is lower in density of impurities than the first outer base area 127a. Thus when the second outer base area 127b and the second emitter area 111b, which is formed in the circumference of the emitter 111, come near to each other, the breakdown voltage between the emitter and the base is reduced only slightly.

(4) In the present embodiment, the side wall 125 is formed on the side surfaces of the ring-like n-type polycrystal Si film 110. However, without the side wall 125, the same advantageous effect can be produced by forming the high impurity density first outer base area 127a and the low impurity density second outer base area 127b in the outer base area.

(5) The present embodiment can provide the above-described functions/effects regardless of whether the second emitter area 111b is present, and regardless of whether the n-type polycrystal Si film 110 is connected with the emitter electrode 116.

Third Embodiment

Figure 17:
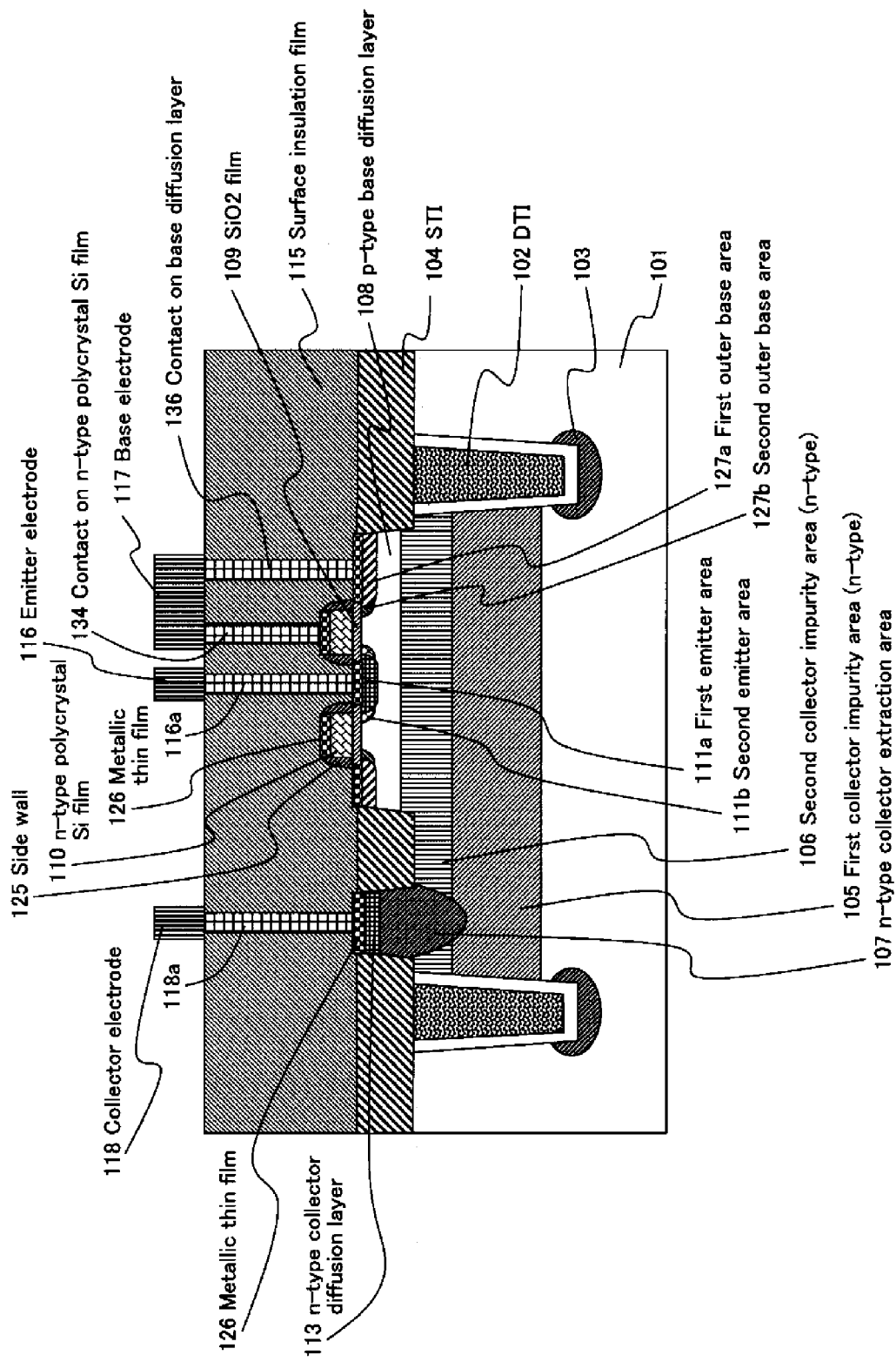
FIG. 17 is a cross-sectional view showing the semiconductor apparatus in the third embodiment.

The following describes a semiconductor apparatus and a manufacturing method thereof in the third embodiment of the present invention with reference to the attached drawings. FIG. 17 is a cross-sectional view showing the semiconductor apparatus in the third embodiment of the present invention. Note that the portions that are the same as the structural portions having been explained with reference to FIGS. 1 through 16 are attached the same reference signs and description thereof is omitted. FIG. 17 is a cross-sectional view showing a vertical-type NPN bipolar transistor contained in the semiconductor apparatus.

As shown in FIG. 17, based on the structure shown in FIG. 14, contacts 134 and 136 are formed so that the ring-like n-type polycrystal Si film 110 and the first outer base area 127a are connected with the base electrode 117, respectively.

According to the semiconductor apparatus and the manufacturing method thereof in the present embodiment, the ring-like n-type polycrystal Si film 110 and the first outer base area 127a, which are both conductive, are connected by the contacts 134 and 136, the ring-like n-type polycrystal Si film 110 has the same electric potential as the p-type base diffusion layer 108. Accordingly, the parasitic capacitance component by the $SiO_2$ film 109 between the ring-like n-type polycrystal Si film 110 and the p-type base diffusion layer 108 does not have an influence on the high-frequency characteristics of the transistor. As a result, the "ft" of the transistor is improved, and especially the characteristics of the analog circuit that deals with the high-frequency signals are improved.

Also, in the conductive ring-like n-type polycrystal Si film 110, when the electric potential thereof is not fixed (when it is in the floating state) and a transistor is in the vicinity of a line through which a signal with a large amplitude voltage flows, an external signal voltage is apt to enter via the ring-like n-type polycrystal Si film 110 in the floating state, and appear as a noise component at the output terminal of the transistor. However, by fixing the conductive ring-like n-type polycrystal Si film 110 to the base electric potential, it is possible to reduce the entering of signals from other circuits, and reduce the noise of analog circuits.

Fourth Embodiment

Figure 18:
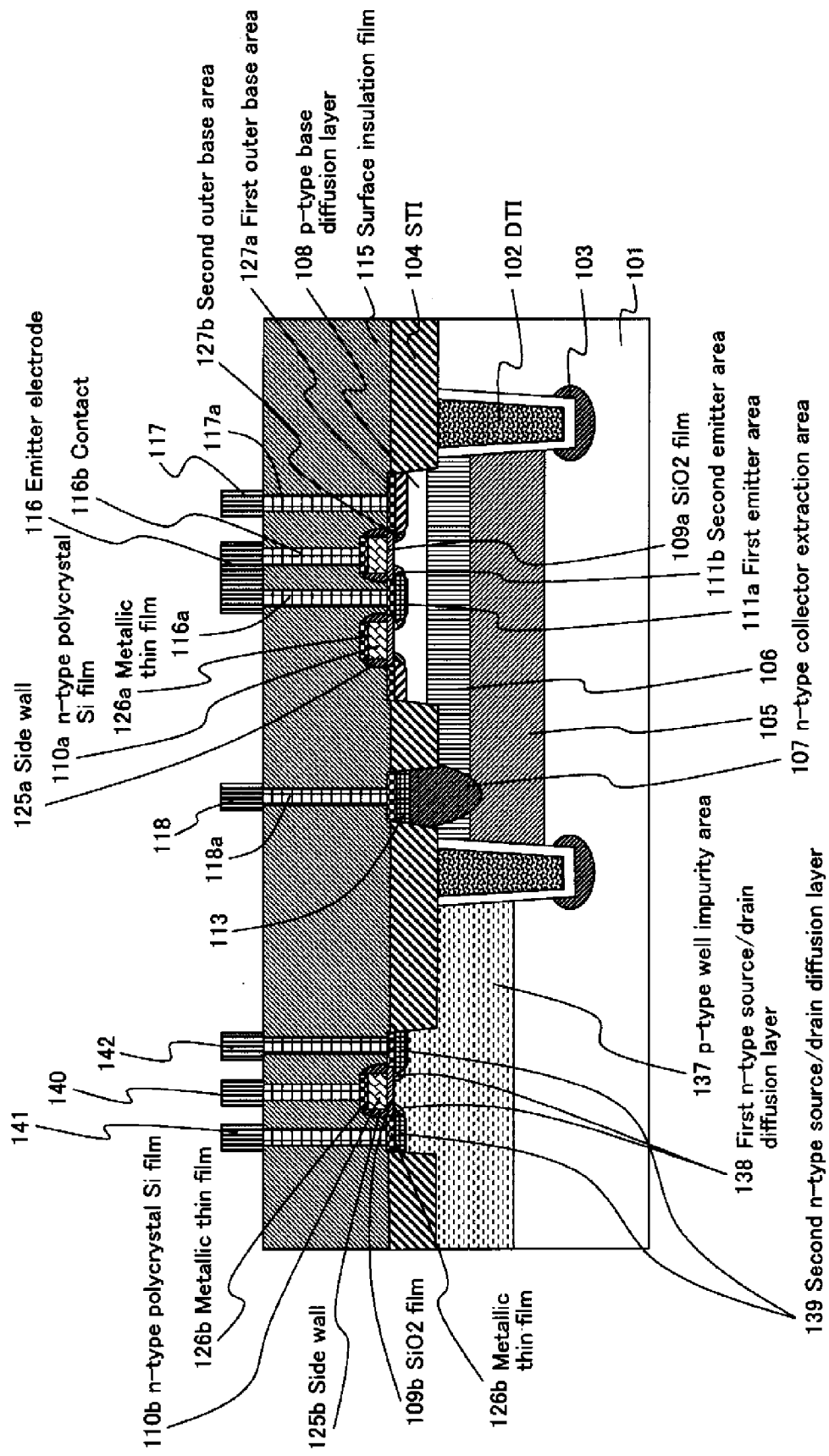
FIG. 18 is a cross-sectional view showing the semiconductor apparatus in the fourth embodiment.

The following describes a semiconductor apparatus and a manufacturing method thereof in the fourth embodiment of the present invention with reference to the attached drawings. FIG. 18 is a cross-sectional view showing the semiconductor apparatus in the fourth embodiment of the present invention. Note that the portions that are the same as the structural portions having been explained with reference to FIGS. 1 through 17 are attached the same reference signs and description thereof is omitted. Also note that, with respect to the $SiO_2$ film 109, the n-type polycrystal Si film 110, the side wall 125 and the like, an additional sign is attached to the sign thereof to indicate whether it belongs to a bipolar transistor (for example, "$SiO_2$ film 109a") or a MOS transistor (for example, "$SiO_2$ film 109b").

FIG. 18 is a cross-sectional view showing a vertical-type NPN bipolar transistor (hereinafter referred to as "NPN transistor") and an N-channel-type MOS transistor contained in the semiconductor apparatus.

In FIG. 18, the NPN transistor has the same structure as the one shown in FIG. 14. The N-channel-type MOS transistor (hereinafter referred to as "MOS transistor") includes an $SiO_2$ film 109b, which is to be a gate insulation film deposited on a p-type well impurity area 137, and an n-type polycrystal Si film 110b which is to be a gate electrode. Also, a side wall 125b is formed on the side surfaces of the n-type polycrystal Si film 110b which is to be a gate electrode.

The MOS transistor includes a low impurity density first n-type source/drain diffusion layer 138 that is formed by the ion implantation before the side wall 125b is formed, and a high impurity density second n-type source/drain diffusion layer 139 that is formed after the side wall 125b is formed. Furthermore, the MOS transistor includes a metallic thin film 126b, a gate electrode 140, a source electrode 141, and a drain electrode 142.

<Manufacturing Method>

Since the manufacturing method of the NPN transistor has already been explained, most of the explanation will be omitted in the following. Note that the ring-like $SiO_2$ film 109a is formed at the same time as the gate insulation film ($SiO_2$ film 109b) of the MOS transistor in the same step, and the ring-like n-type polycrystal Si film 110a is formed at the same time as the gate electrode (n-type polycrystal Si film 110b) of the MOS transistor in the same step.

The following describes the manufacturing method of the MOS transistor.

(Low Impurity Density First n-Type Source/Drain Diffusion Layer)

The low impurity density first n-type source/drain diffusion layer 138 (a "low impurity density area" of source/drain) is formed by performing the ion implantation 120 of a low impurity density phosphorus (P) at the first ion implantation angle after the gate insulation film ($SiO_2$ film 109b) and the gate electrode (n-type polycrystal Si film 110b) of the MOS transistor are formed on the p-type well impurity area 137. At this time, the low impurity density emitter diffusion layer 112b is formed at the same time as the low impurity density first n-type source/drain diffusion layer 138 (first ion implantation step).

Note that the above-described ion implantation is performed when the NPN transistor is in the state shown in FIG. 5.

(High Impurity Density Second n-Type Source/Drain Diffusion Layer)

The high impurity density second n-type source/drain diffusion layer 139 (a "body area" of source/drain) is formed by performing the ion implantation 122 of a high impurity density arsenic (As) at the second ion implantation angle after the side wall 125b is formed on the side surfaces of the gate electrode (n-type polycrystal Si film 110b). At this time, the high impurity density emitter diffusion layer 112a is formed at the same time as the high impurity density second n-type source/drain diffusion layer 139 (second ion implantation step).

Note that the above-described ion implantation is performed when the NPN transistor is in the state shown in FIG. 9.

More specifically, the "low impurity density area" of source/drain is constituted from a portion of the low impurity density first n-type source/drain diffusion layer 138 in which the high impurity density second n-type source/drain diffusion layer 139 has not been formed. This applies to the "low impurity density source area" and "low impurity density drain area" as well. Each of the "source body area" and "drain body area" is constituted from a portion in which the high impurity density second n-type source/drain diffusion layer 139 has been formed.

<Function, Effect and Others>

(1) In order to achieve a high-performance analog-digital mixed integrated circuit, it is necessary to load a bipolar transistor into a CMOS transistor, with a small number of steps added. In the semiconductor apparatus of the present embodiment, the low impurity density emitter diffusion layer 112b, which is low in density of impurities, and the first n-type source/drain diffusion layer 138 have the same density of impurities and are formed at the same time in the same step. Also, the high impurity density emitter diffusion layer 112a, which is high in density of impurities, and the high impurity density second n-type source/drain diffusion layer 139 have the same density of impurities and are formed at the same time in the same step.

With this structure, it is possible to reduce the afore-mentioned emitter-base junction leak, and load a high-performance bipolar transistor, which has excellent hFE linearity and is low in base resistance, into an N-channel MOS transistor, with a small number of steps added.

(2) Furthermore, the step of forming the ring-like $SiO_2$ film 109a for the bipolar transistor can be used in common with the step of forming the gate insulation film for the MOS transistor; the step of forming the ring-like n-type polycrystal Si film 110a for the bipolar transistor can be used in common with the step of forming the gate electrode for the MOS transistor; and the step of forming the side wall 125a on the side surfaces of the ring-like n-type polycrystal Si film 110a for the bipolar transistor can be used in common with the step of forming the side wall 125b on the side surfaces of the gate electrode for the MOS transistor. As a result, it is possible to form the afore-mentioned high-performance bipolar transistor, only with a very small number of steps added into the manufacturing process of the MOS transistor. This reduces the cost and prevents the MOS transistor characteristics from being deteriorated.

(3) The present embodiment can provide the above-described functions/effects regardless of whether the second outer base area 127b is present, and regardless of whether the n-type polycrystal Si film 110a is connected with the emitter electrode 116.

Fifth Embodiment

Figure 19:
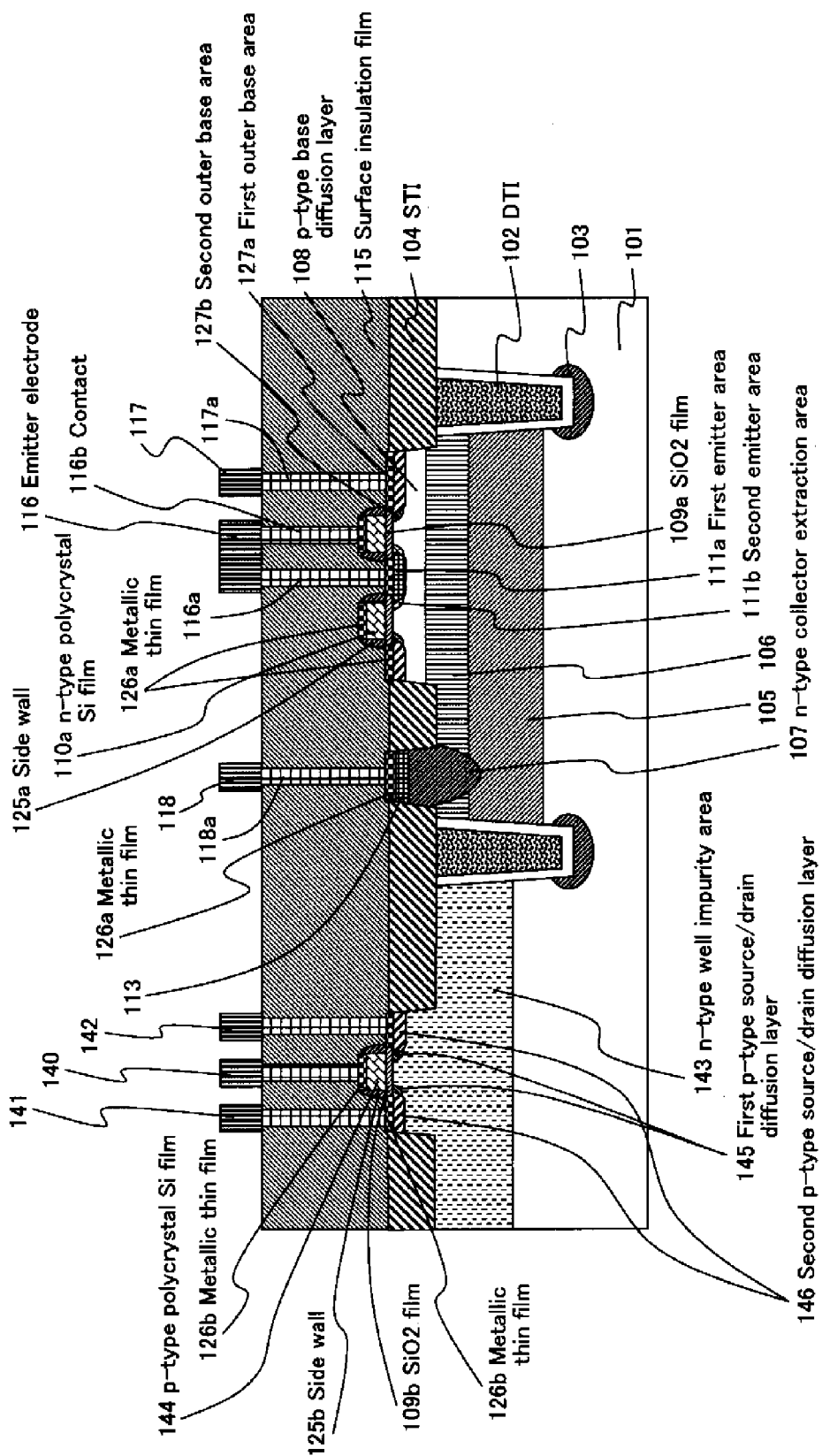
FIG. 19 is a cross-sectional view showing the semiconductor apparatus in the fifth embodiment.
Figure 20A:
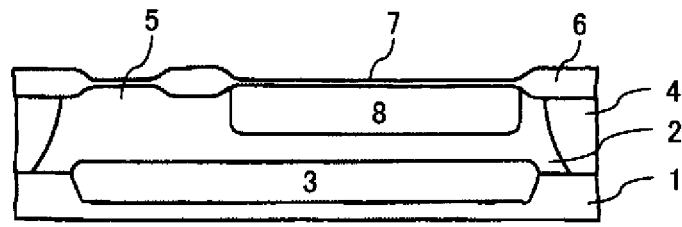
FIGS. 20A through 20D are cross-sectional views showing manufacturing steps of a conventional semiconductor apparatus.
Figure 20B:
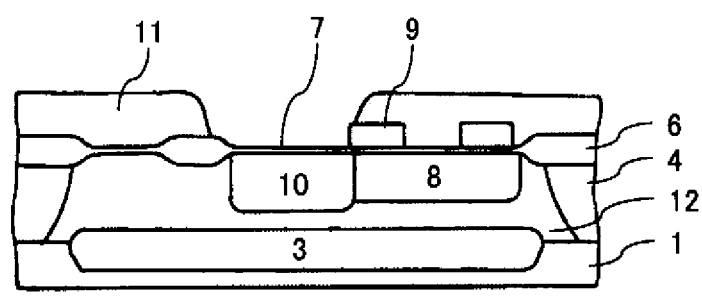
Figure 20C:
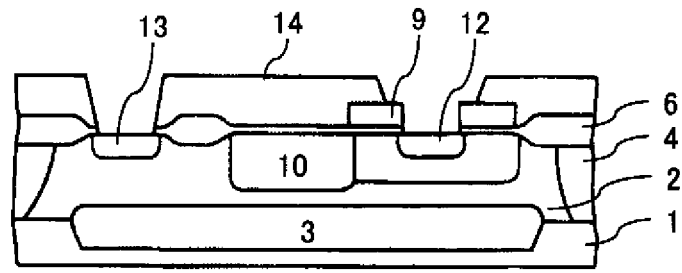
Figure 20D:
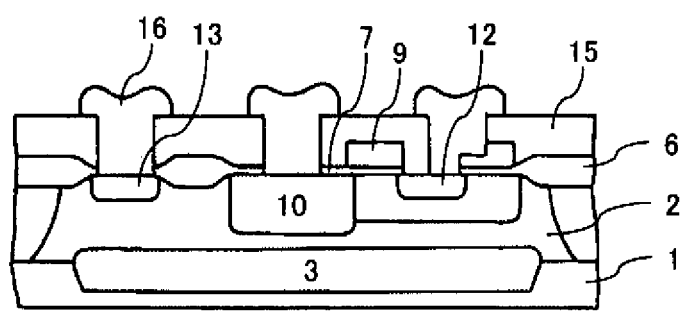

The following describes a semiconductor apparatus and a manufacturing method thereof in the fifth embodiment of the present invention with reference to the attached drawings. FIG. 19 is a cross-sectional view showing the semiconductor apparatus in the fifth embodiment of the present invention. Note that the portions that are the same as the structural portions having been explained with reference to FIGS. 1 through 18 are attached the same reference signs and description thereof is omitted. Also note that, with respect to the $SiO_2$ film 109, the side wall 125 and the like, an additional sign is attached to the sign thereof to indicate whether it belongs to a bipolar transistor (for example, "$SiO_2$ film 109a") or a MOS transistor (for example, "$SiO_2$ film 109b").

FIG. 19 is a cross-sectional view showing a vertical-type NPN bipolar transistor and a P-channel-type MOS transistor contained in the semiconductor apparatus.

In FIG. 19, the NPN transistor has the same structure as the one shown in FIG. 14. The P-channel-type MOS transistor (hereinafter referred to as "MOS transistor") includes an $SiO_2$ film 109b, which is to be a gate insulation film deposited on an n-type well impurity area 143, and a p-type polycrystal Si film 144 which is to be a gate electrode. Also, a side wall 125b is formed on the side surfaces of the p-type polycrystal Si film 144 which is to be a gate electrode.

The MOS transistor includes a low impurity density first p-type source/drain diffusion layer 145 that is formed by the ion implantation before the side wall 125b is formed, and a high impurity density second p-type source/drain diffusion layer 146 that is formed after the side wall 125b is formed. Furthermore, the MOS transistor includes a metallic thin film 126b, a gate electrode 140, a source electrode 141, and a drain electrode 142.

<Manufacturing Method>

Since the manufacturing method of the NPN transistor has already been explained, most of the explanation will be omitted in the following. Note that the ring-like $SiO_2$ film 109a is formed at the same time as the gate insulation film ($SiO_2$ film 109b) of the MOS transistor in the same step. Also, the ring-like n-type polycrystal Si film 110a is formed at the same time as the gate electrode (p-type polycrystal Si film 144) of the MOS transistor in the same step, except for doping of impurities.

The following describes the manufacturing method of the MOS transistor.

(Low Impurity Density First p-Type Source/Drain Diffusion Layer)

The low impurity density first p-type source/drain diffusion layer 145 ("low impurity density area" for source/drain) is formed by performing the ion implantation 130 of a low impurity density boron (B) at the third ion implantation angle after the gate insulation film (SiO$_2$ film 109b) and the gate electrode (p-type polycrystal Si film 144) are formed on the n-type well impurity area 143. At this time, the low impurity density outer base diffusion layer 128 is formed at the same time as the low impurity density first p-type source/drain diffusion layer 145 (third ion implantation step).

Note that the above-described ion implantation is performed when the NPN transistor is in the state shown in FIG. 15.

(High Impurity Density Second p-Type Source/Drain Diffusion Layer)

The high impurity density second p-type source/drain diffusion layer 146 (a "body area" of source/drain) is formed by performing the ion implantation 132 of a high impurity density boron (B) at the fourth ion implantation angle after the side wall 125b is formed on the side surfaces of the gate electrode (p-type polycrystal Si film 144). At this time, the high impurity density outer base diffusion layer 128a is formed at the same time as the high impurity density second p-type source/drain diffusion layer 146 (fourth ion implantation step).

Note that the above-described ion implantation is performed when the NPN transistor is in the state shown in FIG. 16.

More specifically, in the present embodiment, the "low impurity density area" of source/drain is constituted from a portion of the low impurity density first p-type source/drain diffusion layer 145 in which the high impurity density second p-type source/drain diffusion layer 146 has not been formed. This applies to the "low impurity density source area" and "low impurity density drain area" as well. Each of the "source body area" and "drain body area" is constituted from a portion in which the high impurity density second p-type source/drain diffusion layer 146 has been formed.

<Function, Effect and Others>

(1) In order to achieve a high-performance analog-digital mixed integrated circuit, it is necessary to load a bipolar transistor into a CMOS transistor, with a small number of steps added. In the semiconductor apparatus of the present embodiment, the low impurity density outer base diffusion layer 128b, which is low in density of impurities, and the low impurity density first p-type source/drain diffusion layer 145 have the same density of impurities and are formed at the same time in the same step. Also, the high impurity density outer base diffusion layer 128a, which is high in density of impurities, and the high impurity density second p-type source/drain diffusion layer 146 have the same density of impurities and are formed at the same time in the same step.

With this structure, it is possible to reduce the afore-mentioned emitter-base junction leak, and load a high-performance bipolar transistor, which has excellent hFE linearity and is low in base resistance, onto the same substrate together with an P-channel MOS transistor, with a small number of steps added.

(2) Furthermore, the step of forming the ring-like SiO$_2$ film 109a for the bipolar transistor can be used in common with the step of forming the gate insulation film for the MOS transistor. Also, the step of forming the ring-like n-type polycrystal Si film 110 for the bipolar transistor can be used in common with the step of forming the p-type polycrystal Si film 144 which is to be the gate electrode for the P-channel MOS transistor, except for doping of impurities. Also, the step of forming the side wall 125a on the side surfaces of the ring-like n-type polycrystal Si film 110 for the bipolar transistor can be used in common with the step of forming the side wall 125b on the side surfaces of the gate electrode for the P-channel MOS transistor. With such common use of formation steps, it is possible to form the afore-mentioned high-performance bipolar transistor, only with a very small number of steps added into the manufacturing process of the P-channel MOS transistor. This reduces the cost and prevents the P-channel MOS transistor characteristics from being deteriorated.

(3) The present embodiment can provide the above-described functions/effects regardless of whether the second emitter area 111b is present, and regardless of whether the n-type polycrystal Si film 110a is connected with the emitter electrode 116.

[Others]

(1) Up to now, the present invention has been described through the first to fifth embodiments and the modifications thereof. However, the present invention is not limited to the above-described embodiments, but may include other applications and the like which are within the concept of the present invention.

(2) The structural elements of the above-described five embodiments and the modifications thereof may be combined in an arbitrary manner within the scope of the present invention.

(3) In the embodiments of the present invention, some cases with a ring-like n-type polycrystal Si film are explained. However, the ring-like n-type polycrystal Si film may be an insulation film. For example, the ring-like n-type polycrystal Si film may be a laminate of a high-permittivity insulation film (high-k film), which is used in the process under the rule of smallness of 45 nm or less, and a metallic film.

(4) In the above description, the bipolar transistor has a structure where a separation area is formed by the deep trench isolation and shallow trench isolation. However, the present invention can be applied to a bipolar transistor in which the PN separation is used.

(5) In the above description, a collector impurity area is formed in the collector area by an ion implantation. However, the present invention can be applied to a structure in which a collector impurity area is formed by a buried collector layer and an epitaxial film.

(6) In the embodiments of the present invention, the NPN transistor is explained. However, the present invention can be applied to the PNP transistor as well.

INDUSTRIAL APPLICABILITY

The present invention can be used as a semiconductor apparatus including a bipolar transistor that is used in the BiMOS circuit or the BiCMOS circuit, or as a manufacturing method thereof.

DESCRIPTION OF CHARACTERS 1 semiconductor substrate
3 buried area
8 inner base
9 ring-like polysilicon
10 outer base
12 emitter
13 collector contact
16 electrode
101 p-type semiconductor substrate
105 first collector impurity area
106 second collector impurity area
108 p-type base diffusion layer
109 SiO$_2$ film
110 n-type polycrystal Si film
111*a* first emitter area
111*b* second emitter area
112*a* high impurity density emitter diffusion layer>
112*b* low impurity density emitter diffusion layer>
114 p-type base diffusion layer
116 emitter electrode
116*b* contact
117 base electrode
120 ion implantation of low impurity density P
122 ion implantation of high impurity density As
124 ion implantation of high impurity density B
125 side wall
126 metallic thin film
127*a* first outer base area
127*b* second outer base area
128*a* first outer base diffusion layer
128*b* second outer base diffusion layer
130 ion implantation of low impurity density B
132 ion implantation of high impurity density B
134 contact on the n-type polycrystal Si film
135 shared contact which is in contact with the emitter diffusion layer and the n-type polycrystal Si film
138 first n-type source/drain diffusion layer
139 second n-type source/drain diffusion layer
140 gate electrode
144 p-type polycrystal Si film
145 first p-type source/drain diffusion layer
146 second p-type source/drain diffusion layer

What is claimed is:
1. A semiconductor apparatus, comprising:
a collector layer formed in a semiconductor substrate;
a base formed on the collector layer in the semiconductor substrate;
an emitter formed above the collector layer via the base and being surrounded by the base except for an upper surface thereof;
a conductive film laminated on, with an insulation film therebetween, an upper surface of the semiconductor substrate above a circumference of the emitter and a part of the base that is adjacent to the emitter, the conductive film being electrically connected with a predetermined wiring; and
a first MOS transistor which has been formed in an area of the semiconductor substrate that is different from an area in which the base is formed, the first MOS transistor including a first source, a first drain, and a first gate electrode, the first source and the first drain of the first MOS transistor having a same conductive type as the emitter,
wherein the emitter includes:
a first emitter area including an area above which the conductive film is not laminated; and
a second emitter area being a remaining area of the emitter excluding the first emitter area, wherein the second emitter area is positioned under the conductive film, is sandwiched between the first emitter area and the base at least in an upper side of the semiconductor substrate, and is lower in density of impurities than the first emitter area, and
wherein each of the first source and the first drain includes:
a body area including an area above which the first gate electrode is not laminated; and a low impurity density area being lower in density of impurities than the body area and formed at a position under the first gate electrode, and
the first emitter area and the body area of each of the first source and the first drain have equivalent impurities and density of impurities, and the low impurity density area and the second emitter area have equivalent impurities and density of impurities.

2. The semiconductor apparatus of claim 1 further comprising
an emitter electrode connected with an upper surface of the emitter, wherein
the predetermined wiring electrically connected with the conductive film is the emitter electrode.

3. The semiconductor apparatus of claim 1 further comprising
a base electrode connected with an upper surface of the base, wherein
the predetermined wiring electrically connected with the conductive film is the base electrode.

4. The semiconductor apparatus of claim 1, wherein
the base includes:
a base body area positioned under the conductive film at least in an upper surface area of the semiconductor substrate;
a base contact area which is higher in density of impurities than the base body area and is separated from the emitter by the base body area, wherein
the base contact area includes:
a first base contact area connected with the base electrode; and
a second base contact area formed to be sandwiched, at least in the upper surface area of the semiconductor substrate, between the first base contact area and a part of the base body area that is under the conductive film, the second base contact area being lower in density of impurities than the first base contact area.

5. The semiconductor apparatus of claim 4 further comprising:
a second MOS transistor which has been formed in an area of the semiconductor substrate that is different from an area in which the base is formed, the second MOS transistor including a second source, a second drain, and a second gate electrode, the second source and the second drain of the second MOS transistor having a same conductive type as the base,
each of the second source and the second drain includes: a body area including an area above which the second gate electrode is not laminated; and a low impurity density area being lower in density of impurities than the body area and formed at a position under the second gate electrode, and
the first base contact area and the body area of each of the second source and the second drain have equivalent impurities and density of impurities, and the low impurity density area and the second base contact area have equivalent impurities and density of impurities.

6. A semiconductor apparatus, comprising:

a collector layer formed in a semiconductor substrate;

a base formed on the collector layer in the semiconductor substrate;

an emitter formed above the collector layer via the base and being surrounded by the base except for an upper surface thereof;

a conductive film laminated on, with an insulation film therebetween, an upper surface of the semiconductor substrate above a circumference of the emitter and a part of the base that is adjacent to the emitter, the conductive film being electrically connected with a predetermined wiring, a MOS transistor which has been formed in an area of the semiconductor substrate that is different from an area in which the base is formed, the MOS transistor including a source, a drain, and a gate electrode, the source and the drain of the MOS transistor having a same conductive type as the base, wherein the base includes:

a base body area positioned under the conductive film at least in an upper surface area of the semiconductor substrate; and a base contact area which is higher in density of impurities than the base body area and is separated from the emitter by the base body area, wherein the base contact area includes:
a first base contact area connected with the base electrode; and
a second base contact area formed to be sandwiched, at least in the upper surface area of the semiconductor substrate, between the first base contact area and a part of the base body area that is under the conductive film, the second base contact area being lower in density of impurities than the first base contact area;

wherein each of the source and the drain includes:
a body area including an area above which the gate electrode is not laminated; and
a low impurity density area being lower in density of impurities than the body area and formed at a position under the gate electrode, and wherein the first base contact area and the body area of each of the source and the drain have equivalent impurities and density of impurities, and the low impurity density area and the second base contact area have equivalent impurities and density of impurities.

7. The semiconductor apparatus of claim 6, further comprising:

an emitter electrode connected with an upper surface of the emitter, wherein the conductive film is electrically connected with the emitter electrode.

8. The semiconductor apparatus of claim 6, further comprising:

a base electrode connected with an upper surface of the base, wherein the conductive film is electrically connected with the base electrode.

* * * * *